United States Patent
Yamamoto et al.

(10) Patent No.: US 10,085,346 B2
(45) Date of Patent: Sep. 25, 2018

(54) METHOD FOR PRODUCING CONDUCTIVE MEMBER, AND CONDUCTIVE MEMBER

(71) Applicant: FUJIFILM Corporation, Tokyo (JP)

(72) Inventors: Kenichi Yamamoto, Ashigara-kami-gun (JP); Naoharu Kiyoto, Ashigara-kami-gun (JP); Kenji Naoi, Ashigara-kami-gun (JP)

(73) Assignee: FUJIFILM Corporation, Tokyo (JP)

( * ) Notice: Subject to any disclaimer, the term of this patent is extended or adjusted under 35 U.S.C. 154(b) by 154 days.

(21) Appl. No.: 15/228,472

(22) Filed: Aug. 4, 2016

(65) Prior Publication Data
US 2016/0345439 A1 Nov. 24, 2016

Related U.S. Application Data

(63) Continuation of application No. PCT/JP2015/051686, filed on Jan. 22, 2015.

(30) Foreign Application Priority Data

Mar. 19, 2014 (JP) .................... 2014-056748

(51) Int. Cl.
*G06F 3/044* (2006.01)
*H05K 3/06* (2006.01)
(Continued)

(52) U.S. Cl.
CPC .............. *H05K 3/06* (2013.01); *B32B 15/01* (2013.01); *B32B 27/36* (2013.01); *G03C 1/46* (2013.01);
(Continued)

(58) Field of Classification Search
CPC . G06F 3/041; G06F 3/044; G06F 2203/04103
(Continued)

(56) References Cited

U.S. PATENT DOCUMENTS

| 5,858,581 A * | 1/1999 | Stephenson ........... G03F 7/0007 430/311 |
| 2008/0206689 A1 * | 8/2008 | Brooks ................... G03C 5/58 430/401 |
| 2011/0289771 A1 | 12/2011 | Kuriki |

FOREIGN PATENT DOCUMENTS

| JP | 03-171043 | * | 7/1991 |
| JP | 2010-108878 A | | 5/2010 |
| JP | 2012-6377 A | | 1/2012 |

OTHER PUBLICATIONS

Machine translation of JP 03-171043 (Jul. 1991) (Year: 1991).*
(Continued)

*Primary Examiner* — John A McPherson
(74) *Attorney, Agent, or Firm* — Birch, Stewart, Kolasch & Birch, LLP

(57) ABSTRACT

Provided is a method for producing a conductive member including: forming a first silver halide emulsion layer, a light absorption layer, and a second silver halide emulsion layer on a transparent support in this order; performing pattern exposure on the first silver halide emulsion layer; and the second silver halide emulsion layer and applying a development treatment thereto to obtain a conductive layer comprising a thin metal wire, in which the light absorption layer absorbs at least some of the wavelengths of light to which the first silver halide emulsion layer or the second silver halide emulsion layer is exposed.

18 Claims, 10 Drawing Sheets

(51) Int. Cl.
  *B32B 15/01* (2006.01)
  *G03C 1/46* (2006.01)
  *G03C 1/83* (2006.01)
  *G03C 1/85* (2006.01)
  *G06F 3/041* (2006.01)
  *B32B 27/36* (2006.01)
  *G03F 7/20* (2006.01)
  *G03F 7/32* (2006.01)
  *H03K 17/96* (2006.01)
  *H05K 1/02* (2006.01)
  *H05K 1/09* (2006.01)
  *G03F 7/095* (2006.01)
  *H05K 3/10* (2006.01)
  *H05K 3/46* (2006.01)

(52) U.S. Cl.
  CPC .............. *G03C 1/832* (2013.01); *G03C 1/853* (2013.01); *G03F 7/0952* (2013.01); *G03F 7/203* (2013.01); *G03F 7/2022* (2013.01); *G03F 7/2032* (2013.01); *G03F 7/32* (2013.01); *G06F 3/041* (2013.01); *G06F 3/044* (2013.01); *H03K 17/96* (2013.01); *H05K 1/0298* (2013.01); *H05K 1/09* (2013.01); *H05K 3/106* (2013.01); *B32B 2307/202* (2013.01); *B32B 2307/412* (2013.01); *G06F 2203/04103* (2013.01); *H05K 1/0274* (2013.01); *H05K 3/4685* (2013.01); *H05K 2203/125* (2013.01); *H05K 2203/1476* (2013.01); *H05K 2203/1581* (2013.01)

(58) Field of Classification Search
  USPC .................. 430/319, 321; 174/256, 257, 258
  See application file for complete search history.

(56) References Cited

OTHER PUBLICATIONS

International Search Report, issued in PCT/JP2015/051686, dated Apr. 28, 2015.
Japanese Office Action for Japanese Application No. 2014-056748, dated Nov. 1, 2016, with an English translation.
International Preliminary Report on Patentability and translation of the Written Opinion of the International Searching Authority (Forms PCT/IB/338, PCT/IB/373 and PCT/ISA/237) for International Application No. PCT/JP2015/051686, dated Sep. 29, 2016.

* cited by examiner

US 10,085,346 B2

METHOD FOR PRODUCING CONDUCTIVE MEMBER, AND CONDUCTIVE MEMBER

CROSS-REFERENCE TO RELATED APPLICATIONS

This application is a Continuation of PCT International Application No. PCT/JP2015/051686 filed on Jan. 22, 2015, which claims priority under 35 U.S.C. § 119(a) to Japanese Patent Application No. 2014-056748 filed on Mar. 19, 2014. The above application is hereby expressly incorporated by reference, in its entirety, into the present application.

BACKGROUND OF THE INVENTION

1. Field of the Invention

The present invention relates to a conductive member used for a touch panel sensor or the like and a method for producing the conductive member and particularly relates to a conductive member in which at least two layers of different conductive patterns are formed on one surface of a transparent support by performing pattern exposure on at least two silver halide emulsion layers formed on one surface of the transparent support and applying a development treatment thereto and a method of producing the conductive member.

2. Description of the Related Art

In recent years, a touch panel sensor has been widely used as an input device of a mobile terminal and a computer. A touch panel sensor is disposed on the surface of a display, and an input operation can be performed by detecting positions touched by a finger or the like.

Currently, there is a demand for a decrease in the number of components for the purpose of simplifying the configuration of a touch panel sensor, for example, reducing a layer thickness and reducing the number of processes. For example, a method for producing a conductive sheet described in JP2012-6377A has been suggested.

In JP2012-6377A, a photosensitive material including a first photosensitive layer formed on one main surface of a transparent support such as a plastic film and a second photosensitive layer formed on the other main surface of the transparent support is exposed to light during production of a conductive sheet. In this liquid exposure treatment, a first light exposure treatment of exposing the first photosensitive layer to light along a first light exposure pattern by irradiating the transparent support with light and a second light exposure treatment of exposing the second photosensitive layer to light along a second light exposure pattern by irradiating the transparent support with light are performed (both surfaces are exposed to light simultaneously). When the photosensitive material is subjected to a development treatment after light exposure, a transparent support, a first conductive layer formed on one main surface of the transparent support along the first light exposure pattern, and a second conductive layer formed on the other main surface of the transparent support along the second light exposure pattern are obtained.

SUMMARY OF THE INVENTION

As described in JP2012-6377A, when an electrode pattern of the first conductive layer and the second conductive layer is provided on both surfaces of one transparent support, this improves the production efficiency of a conductive member and contributes to reducing a layer thickness. However, in order to protect a bottom electrode on a liquid crystal cell side from an external force or moisture exposure, it is necessary to adhere a hard coat polyethylene terephthalate (PET) film (hereinafter, also referred to as a HC-PET film). For this reason, the provision of the electrode pattern does not greatly contribute to reducing the thickness of the touch panel sensor and does not lead to a reduction of man hours for a process of producing a touch panel sensor.

In addition, a touch panel sensor 100 having a structure shown in FIG. 11A is suggested. In the touch panel sensor 100 shown in FIG. 11A, when two sheets of conductive members 102 respectively having one electrode pattern 106 on one surface of a transparent support 104 such as a resin film or the like overlap each other using an optically transparent adhesive 108, an electrode pattern (bottom electrode portion) of the conductive member 102 on the lower side is protective from an external force or moisture even when a HC-PET film is not present. A cover glass 110 is provided on the conductive member 102, which is the upper side, through the optically transparent adhesive 108. A liquid crystal cell 114 is provided on the rear surface of the conductive member 102, which is the lower side, through an optically transparent resin layer 112.

In the touch panel sensor 100 of the related art shown in FIG. 11A, two transparent supports 104 are required for a production process, and there is no indication of a reduction in layer thickness or a reduction in man hours.

Moreover, a touch panel sensor 100a having a structure shown in FIG. 11B is suggested. The touch panel sensor 100a of the related art shown in FIG. 11B includes the conductive member 102 having the electrode pattern 106 formed on both surfaces of the transparent support 104. In the touch panel sensor 100a, an electrode, an insulating unit, an electrode are sequentially formed using a photolithography method, and the electrode pattern 106 having two axes of XY is formed on the respective surfaces of the transparent support 104. A HC-PET film 116 is provided on the electrode pattern 106, which is the lower side, through the optically transparent adhesive 108. In this manner, the electrode pattern is protected from an external force and moisture and it is possible to achieve both of a reduction in layer thickness and protection from moisture exposure. However, there are problems in that the man-hours are increased and the productivity becomes worse. Further, in the touch panel sensor 100a, the cover glass 110 is provided on the upper side of the conductive member 102 through the optically transparent adhesive 108, and the liquid crystal cell 114 is provided on the lower side of the HC-PET film 116 through the optically transparent resin layer 112.

An object of the present invention is to provide a method for producing a conductive member which is capable of solving the above-described problems of the related art and reducing the number of production processes more than the existing one; and a conductive member having fewer members than the existing one.

In order to solve the above-described problems, a first aspect of the present invention provides a method for producing a conductive member comprising: forming a first silver halide emulsion layer, a light absorption layer, and a second silver halide emulsion layer on a transparent support in this order; and performing pattern exposure on the first silver halide emulsion layer and the second silver halide emulsion layer and applying a development treatment thereto to obtain a conductive layer including a thin metal wire, in which the light absorption layer absorbs at least a part of the wavelengths of light to which the first silver halide emulsion layer or the second silver halide emulsion layer is exposed.

It is preferable that a pattern in which the first silver halide emulsion layer is exposed to light is different from a pattern in which the second silver halide emulsion layer is exposed to light, at least in part, in the performing of the pattern exposure on the first silver halide emulsion layer and the second silver halide emulsion layer.

It is preferable that the spectral sensitivity of the first silver halide emulsion layer is different from the spectral sensitivity of the second silver halide emulsion layer, the first silver halide emulsion layer and the second silver halide emulsion layer are respectively exposed to light having wavelengths different from each other, from one side of a front surface and a rear surface of the transparent support, and the light absorption layer absorbs either of the light having wavelengths different from each other.

It is preferable that the spectral sensitivity of the first silver halide emulsion layer is the same as the spectral sensitivity of the second silver halide emulsion layer, the first silver halide emulsion layer and the second silver halide emulsion layer are respectively exposed to light having the same wavelength, from the surface or the rear surface of the transparent support, and the light absorption layer absorbs light having the same wavelength.

It is preferable that the spectral sensitivity of the first silver halide emulsion layer is different from the spectral sensitivity of the second silver halide emulsion layer, the first silver halide emulsion layer and the second silver halide emulsion layer are respectively exposed to light having wavelengths different from each other, from the surface or the rear surface of the transparent support, and the light absorption layer absorbs either of the light having wavelengths different from each other.

It is preferable that the timing of light exposure of the first silver halide emulsion layer is the same as that of the second silver halide emulsion layer.

It is preferable that the first silver halide emulsion layer and the second silver halide emulsion layer each contain a binder.

It is preferable that the light absorption layer contains a solid dispersion dye, and the coating amount of the solid dispersion dye is in a range of 200 mg/m$^2$ to 1,500 mg/m$^2$. It is preferable that the conductive layer has a lattice-like pattern.

A second aspect of the present invention provides a conductive member comprising: a transparent support; a first conductive layer which includes a thin metal wire on the transparent support; an electrically insulating layer formed on the first conductive layer; and a second conductive layer which includes the thin metal wire on the electrically insulating layer, in this order, in which the thin metal wire contains a binder and has a width of 10 μm or less.

It is preferable that the first conductive layer and the second conductive layer have a lattice-like pattern.

According to the present invention, it is possible to simplify the light exposure process, reduce the number of processes of producing a conductive member more than the existing one, and thus improve the productivity. Further, the obtained conductive member has a configuration in which the first conductive layer, the electrically insulating layer, and the second conductive layer are formed on the transparent support, and it is possible to reduce the number of members more than the existing one and reduce the layer thickness.

DESCRIPTION OF THE PREFERRED EMBODIMENTS

Hereinafter, a method for producing a conductive member and the conductive member of the present invention will be described in detail with reference to preferred embodiments illustrated in the accompanying drawings.

Figure 1:
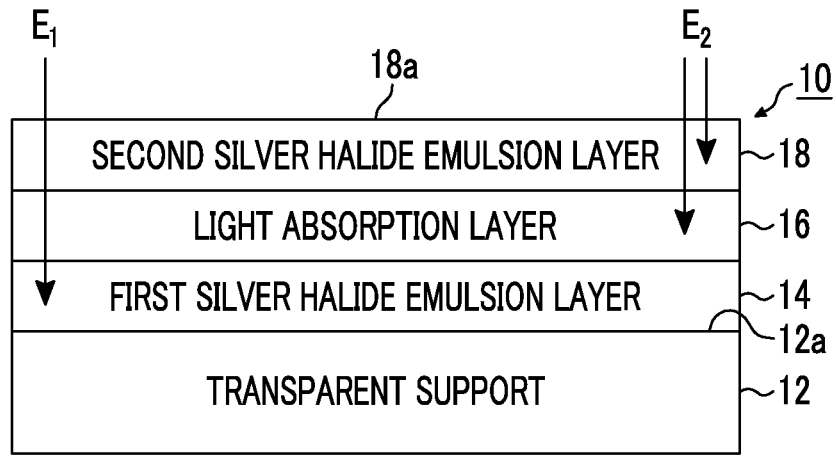
FIG. 1 is a view schematically showing a photosensitive material which becomes a conductive member of a first embodiment of the present invention.
Figure 2:
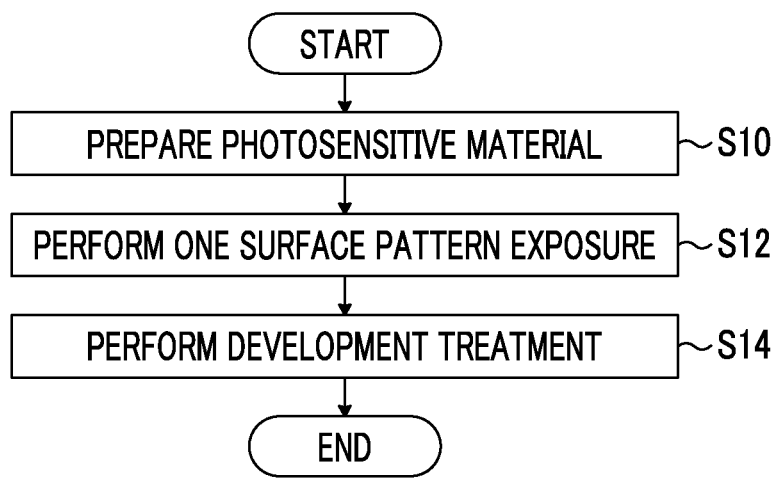
FIG. 2 is a flowchart showing a method for producing a conductive member of the first embodiment of the present invention.
Figure 3A:
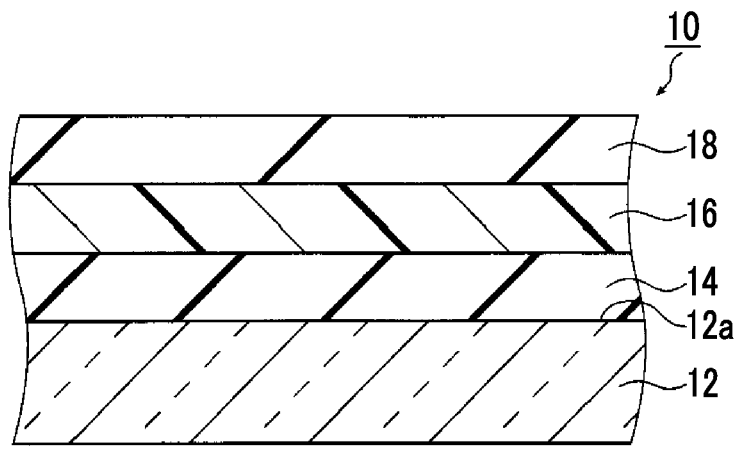
FIGS. 3A to 3C are sectional views schematically showing the method for producing a conductive member of the first embodiment of the present invention.
Figure 3B:
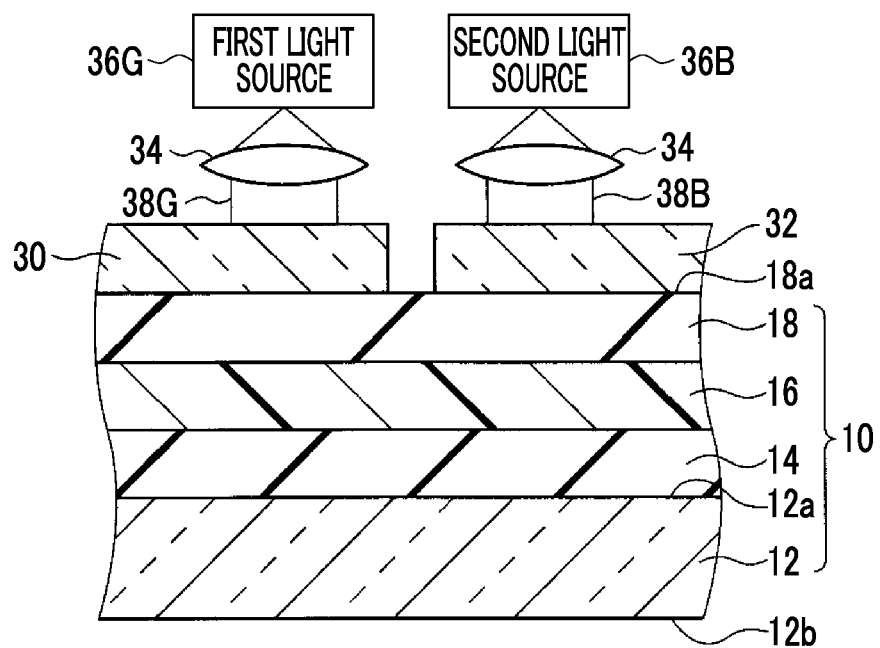
Figure 3C:
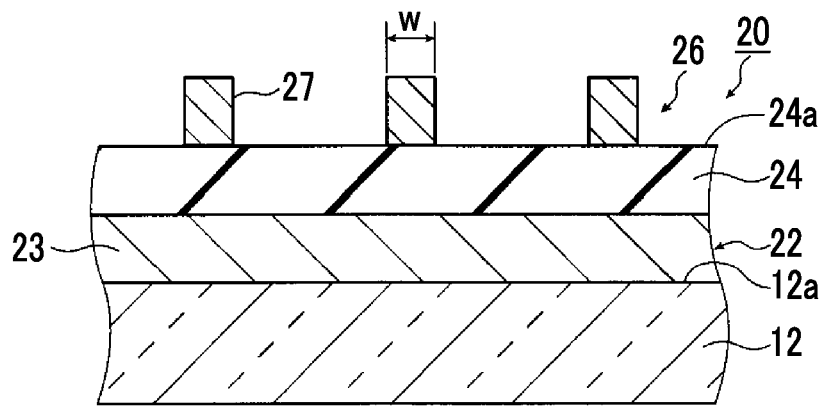

FIG. 1 is a view schematically showing a photosensitive material which becomes a conductive member of a first embodiment of the present invention. FIG. 2 is a flowchart showing a method for producing a conductive member of the first embodiment of the present invention. FIGS. 3A to 3C are sectional views schematically showing the method for producing a conductive member of the first embodiment of the present invention.

In the present invention, as a result of research conducted for the purpose of improving the production efficiency of the conductive member, reducing the number of sheets adhered to each other at the time of production of a touch panel sensor, and protecting an electrode, it is understood that electrode patterns different from each other with two axes of XY can be collectively formed on one surface of a transparent support by simultaneously laminating two photosensitive layers (silver halide emulsion layers), with different spectral sensitivities, on one surface of the transparent support in a state in which an intermediate layer (insulating layer) is interposed therebetween and collectively exposing the laminated layers to light having different wavelength bands for development. When a transparent conductive member laminated on one surface thereof is used, an electrode support is used as a substitute for a protective film having a function for protecting an electrode and thus a protective film such as HC-PET used to protect an electrode becomes unnecessary. Therefore, it is possible to reduce the number of sheets adhered to each other at the time of producing a touch panel sensor. Based on this finding, the present invention has been completed.

For example, a photosensitive material 10 having a laminate structure shown in FIG. 1 is used to produce the conductive member of the present embodiment. The photosensitive material 10 is a material in which a first silver halide emulsion layer 14, a light absorption layer 16, and a second silver halide emulsion layer 18 are laminated on a surface 12a of a transparent support 12 in this order.

The first silver halide emulsion layer 14 is used to form a first conductive layer 22 (see FIG. 3C) of a conductive member 20 (see FIG. 3C) described below and has a spectral sensitivity with respect to a specific wavelength. When a site of the first silver halide emulsion layer 14, which is exposed to first exposure light $E_1$ corresponding to the spectral sensitivity, is subjected to a development treatment, a thin silver metal wire is formed.

The light absorption layer 16 absorbs at least some of the wavelength of exposure light and absorbs light having a specific wavelength or wavelength band. The light absorption layer 16 is electrically insulating and the light absorption layer 16 to which an exposure and development treatment is applied is referred to as an electrically insulating layer 24 (see FIG. 3C) the conductive member 20 (see FIG. 3C) described below. In other words, the light absorption layer 16 also serves as the electrically insulating layer 24 (see FIG. 3C). The light absorption layer 16 contains a binder (gelatin) and a solid dispersion dye described below in detail. The amount of the solid dispersion dye to be applied to the light absorption layer 16 is preferably in a range of 200 mg/m² to 1,500 mg/m².

The second silver halide emulsion layer 18 is used to form a second conductive layer 26 (see FIG. 3C) of the conductive member 20 (see FIG. 3C) described below and has a spectral sensitivity with respect to a specific wavelength different from that of the first silver halide emulsion layer 14. When a site of the second silver halide emulsion layer 18, which is exposed to second exposure light $E_2$ corresponding to the spectral sensitivity, is subjected to a development treatment, a thin silver metal wire is formed.

The first silver halide emulsion layer 14 and the second silver halide emulsion layer 18 have different spectral sensitivities. The first silver halide emulsion layer 14 is configured to have a spectral sensitivity peak with respect to a wavelength of, for example, 500 nm or greater and the second silver halide emulsion layer 18 is configured to have a spectral sensitivity peak with respect to a wavelength of, for example, less than 500 nm. In this case, light having a wavelength of 500 nm or greater is used for the first exposure light $E_1$ and light having a wavelength of less than 500 nm is used for the second exposure light $E_2$. When light exposure is made from a surface 18a side of the second silver halide emulsion layer 18, the light absorption layer 16 absorbs light having a wavelength of less than 500 nm. The first silver halide emulsion layer 14 and the second silver halide emulsion layer 18 are formed by being coated with a photosensitive emulsion coating solution. The configurations of the first silver halide emulsion layer 14 and the second silver halide emulsion layer 18 will be described later in detail.

In the present specification, light having a wavelength of 500 nm or greater to less than 630 nm is conveniently referred to as green light (hereinafter, also referred to as G light) and light having a wavelength of less than 500 nm is referred to as blue light (hereinafter, also referred to as B light). In addition, light having a wavelength of 630 nm or greater is conveniently referred to as red light (hereinafter, also referred to as R light).

When the first silver halide emulsion layer 14 and the second silver halide emulsion layer 18 have spectral sensitivities different from each other, the wavelength regions are not particularly limited. In the present embodiment, G light and B light respectively having a spectral sensitivity are used, and a combination of R light and B light may be used as the combination of spectral sensitivities.

The photosensitive material 10 is exposed to light, for example, from the surface 18a side of the second silver halide emulsion layer 18. In this case, the light absorption layer 16 absorbs the second exposure light $E_2$ of the second silver halide emulsion layer 18. Specifically, when the second silver halide emulsion layer 18 is exposed to B light, the light absorption layer 16 absorbs, for example, B light.

In the production of the conductive member of the present embodiment, as shown in FIG. 2, the photosensitive material 10 having a structure shown in FIG. 1 (FIG. 3A) is firstly prepared (Step S10). In the photosensitive material 10, for example, the first silver halide emulsion layer 14 is formed on the surface 12a of the transparent support 12 using a coating method. Thereafter, the light absorption layer 16 is formed on the first silver halide emulsion layer 14 using the coating method. In addition, the second silver halide emulsion layer 18 is formed on the light absorption layer 16 using the coating method or the like. In this manner, the photosensitive material 10 having a configuration shown in FIG. 3A is formed.

Moreover, when the first silver halide emulsion layer 14, the light absorption layer 16, and the second silver halide emulsion layer 18 can be formed in this order, these layers may be separately formed or the first silver halide emulsion layer 14, the light absorption layer 16, and the second silver halide emulsion layer 18 may be simultaneously formed using a multilayer coating method. The time for preparing the photosensitive material 10 can be shortened by simultaneously laminating these layers for formation.

The photosensitive material 10 shown in FIG. 1 and the photosensitive material 10 shown in FIG. 3A have the same configuration. In the present embodiment, the description is made based on an example in which the first silver halide emulsion layer 14 have a spectral sensitivity with respect to G light, the light absorption layer 16 absorbs B light, and the second silver halide emulsion layer 18 has a spectral sensitivity with respect to B light.

Next, one surface of the photosensitive material 10 is pattern-exposed in order to form a conductive layer (Step S12).

The one surface pattern exposure is performed by aligning a first photomask 30 and a second photomask on the surface 18a of the second silver halide emulsion layer 18 of the photosensitive material 10 and disposing the first photomask 30 and the second photomask 32 to be in close contact with each other, as shown in FIG. 3B. A first light source 36G is disposed to face the first photomask 30 and a second light source 36B is disposed to face the second photomask 32. In a space among the first light source 36O, the second light source 36B, and the second photomask 32, collimator lenses 34 are disposed. In addition, a gap having a length of 2 μm to 10 μm may be provided between the second silver halide emulsion layer 18 and the first photomask 30. The collimator lenses 34 make light from the light sources to parallel light.

The first light source 36G is used to expose the first silver halide emulsion layer 14 to light and irradiate the first silver halide emulsion layer 14 with the first exposure light $E_1$. The second light source 36B is used to expose the second silver halide emulsion layer 18 to light and irradiate the second silver halide emulsion layer 18 with the second exposure light $E_2$. The both configurations of the first light source 36G and the second light source 36B are not particularly limited as long as the first light source 36G and the second light source 36B can irradiate a silver halide emulsion layer, which is a target for light exposure, with light having a wavelength region according to the spectral sensitivity thereof, as the exposure light. The wavelength region of the exposure light according to the spectral sensitivity of a silver halide emulsion layer which is a target for light exposure is appropriately set. In the present embodiment, the first light source 36G is used for irradiation with G light and the second light source 36B is used for irradiation with B light. The first light source 36G and the second light source 36B irradiate a layer with light having different wavelengths.

The first photomask 30 is used to perform pattern exposure on the first silver halide emulsion layer 14 and, for example, a first light exposure pattern is formed on a glass substrate.

The second photomask 32 is used to perform pattern exposure on the second silver halide emulsion layer 18 and, for example, a second light exposure pattern is formed on the glass substrate.

The first light exposure pattern and the second light exposure pattern are conductive patterns of thin metal wires of conductive layers and the width of a thin metal wire to be formed in each pattern is 10 μm or less. The first light exposure pattern and the second light exposure pattern may be the same as or different from each other, at least in part.

When G light 38G is made into parallel light using the collimator lens 34 and the first light source 36G irradiates the first photomask 30 with the parallel light, G light carrying the first light exposure pattern reaches the first silver halide emulsion layer 14 and a latent image of the conductive pattern is formed using the first light exposure pattern. When B light 38B is made into parallel light using the collimator lens 34 and the second light source 36B irradiates the second photomask 32 with the parallel light, B light carrying the second light exposure pattern reaches the second silver halide emulsion layer 18 and a latent image of the conductive pattern is formed using the second light exposure pattern. Moreover, since the light absorption layer 16 absorbs B light, the B light does not reach the first silver halide emulsion layer 14. In this manner, latent images of conductive patterns are respectively formed on the first silver halide emulsion layer 14 and the second silver halide emulsion layer 18 by forming the first silver halide emulsion layer 14 and the second silver halide emulsion layer 18, having different spectral sensitivities, on one surface of the transparent support 12 and performing one-pass light exposure from the surface 12a side of the transparent support 12.

In the present embodiment, the second light exposure pattern is exposed to light by moving the photosensitive material 10 to the second light source 36B side after the first light exposure pattern is exposed to light. Conveyance of the photosensitive material 10 and positioning of the first light exposure pattern and the second light exposure pattern can be carried out suitably using a known method used for formation of a light exposure pattern.

Subsequently, after the light exposure, the photosensitive material 10 on which a latent image is formed is subjected to a development treatment (Step S14). In this manner, the conductive member 20 shown in FIG. 3C is formed. The conductive member 20 is a member in which the first conductive layer 22, the electrically insulating layer 24, and the second conductive layer 26 are formed, in this order, on the surface 12A of the transparent support 12. The first conductive layer 22 is a layer in which a thin silver metal wire 23 is formed in a shape of the first conductive pattern after the first silver halide emulsion layer 14 is exposed to light using the first light exposure pattern. The second conductive layer 26 is a layer in which a thin silver metal wire 27 is formed in a shape of the second conductive pattern after the second silver halide emulsion layer 18 is exposed to light using the second light exposure pattern. The electrically insulating layer 24 is configured of the light absorption layer 16. The both thin metal wires 23 and 27 contain a binder and the width thereof (see the symbol w in FIG. 3C) is 10 μm or less.

Moreover, since the light exposure time and the development time of the first silver halide emulsion layer 14 and the second silver halide emulsion layer 18 variously change according to the types of the first light source 36G and the second light source 36B and the type of a developer, preferable ranges of the numerical values cannot be unconditionally determined, but the light exposure time and the development time are adjusted to a light exposure time and a development time at which the development rate became 100%. The first conductive layer 22 and the second conductive layer 26 may be allowed to carry conductive metals by applying at least one of physical development or a plating treatment to the first conductive layer 22 and the second conductive layer 26.

The configuration in which two light sources of the first light source 36G and the second light source 36B are provided is described, but the present invention is not limited thereto. For example, a configuration in which one light source that is capable of emitting both of G light and B light may be provided. The light sources are not limited to those which can emit G light, B light, and monochromatic light. For example, a combination of a white light source and a color filter can be used. Further, known light sources used for a photolithography method, such as a high pressure mercury lamp, solid laser, and semiconductor laser can be used as the light sources.

In regard to the light exposure method, since the spectral sensitivity of the first silver halide emulsion layer 14 is different from the spectral sensitivity of the second silver halide emulsion layer 18, when the first photomask 30 and the second photomask 32 in accordance with the spectral sensitivities of the first silver halide emulsion layer 14 and the second silver halide emulsion layer 18 are used, the first silver halide emulsion layer 14 and the second silver halide emulsion layer 18 can be simultaneously exposed to light. Here, the term "simultaneously" surely includes temporal matching and also includes light exposure of the first silver halide emulsion layer 14 and the second silver halide emulsion layer 18 through one process. As described above, the case in which the first photomask 30 and the second photomask 32 are aligned and disposed, the first silver halide emulsion layer 14 is exposed to light, and then the second silver halide emulsion layer 18 is exposed to light is not included within the meaning of "simultaneously."

In the present embodiment, two layers of the first silver halide emulsion layer 14 and the second silver halide emulsion layer 18 are provided as photosensitive layers, but the number of layers is not limited thereto. For example, the number of layers may be three or more. In this case, the absorption wavelength region of the light absorption layer is appropriately set such that each silver halide emulsion layer is not exposed to light.

In the production of the conductive member 20 of the present embodiment, a sheet type that uses a transparent support 12 with a predetermined size or a roll-to-roll type that uses a long transparent support 12 can be used for both processes of pattern exposure and the development process for preparing the photosensitive material 10 and the conductive member 20.

In the present embodiment, when the first silver halide emulsion layer 14, the light absorption layer 16, and the second silver halide emulsion layer 18 are provided on the transparent support 12, the conductive patterns of the first conductive layer 22 and the second conductive layer 26 can be pattern-exposed by performing one-pass light exposure. In this manner, the number of processes of producing the conductive member 20 can be reduced more than the existing one and the productivity can be improved.

Moreover, the conductive member 20 of the present embodiment has a configuration in which the first conductive layer 22, the electrically insulating layer 24, and the second conductive layer 26 are formed on the transparent support 12, and the transparent support 12 plays a role of a protective layer of the first conductive layer 22. Accordingly, with this configuration, the number of members can be reduced more than the existing one. Further, since the number of members can be reduced, the layer thickness can be also reduced.

In a case where the conductive member 20 is used as a touch panel, a protective layer is formed on the conductive member 20, and a first terminal wiring pattern 68a derived from a plurality of first conductive patterns 52a and a second terminal wiring pattern 68b derived from a plurality of second conductive patterns 52b are connected to, for example, an integrated circuit (IC circuit) that performs position calculation through a connector.

Figure 4:
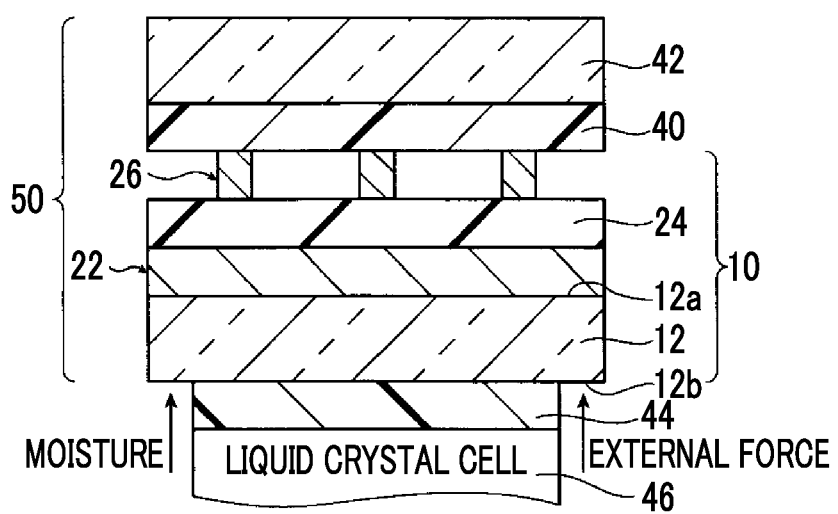
FIG. 4 is a sectional view schematically showing a touch panel sensor using the conductive member of the first embodiment of the present invention.

On the surface 12a side of the transparent support 12 of the conductive member 20, a cover glass 42 is provided on the second conductive layer 26 through an optically transparent adhesive layer 40 as shown in FIG. 4. A liquid crystal cell 46 is provided on the rear surface 12b side of the transparent support 12 through an optically transparent resin layer 44. The conductive member 20 is protected by the transparent support 12 from an external force and moisture exposure. Further, a portion from the transparent support 12 to the cover glass 42 is referred to as a sensor unit 50.

When a fingertip touches the cover glass 42, a signal from the first conductive pattern 52a and the second conductive pattern 52b facing the fingertip is transmitted to the IC circuit. The IC circuit calculates the position of the fingertip based on the supplied signal. Therefore, positions of respective fingertips can be detected by touching the cover glass with two fingertips at the same time.

Next, a second embodiment of the present invention will be described.

Figure 5:
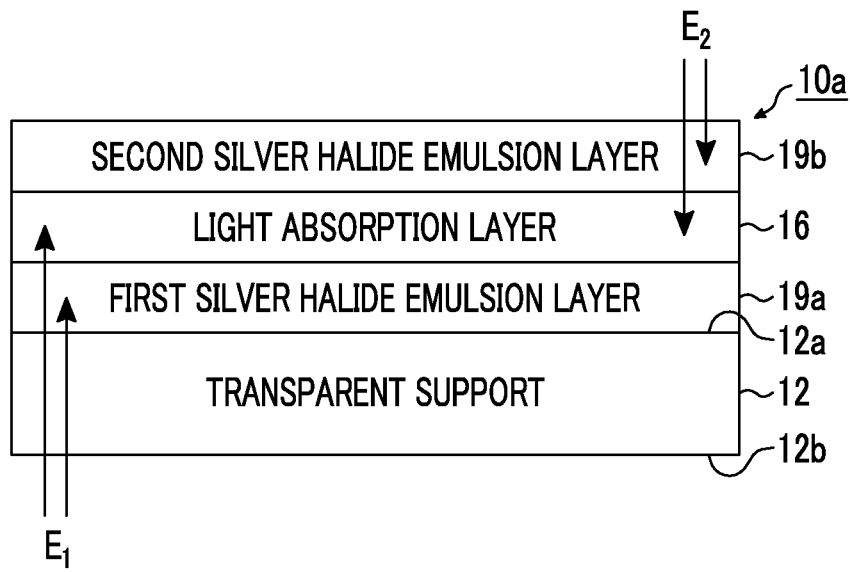
FIG. 5 is a view schematically showing a photosensitive material which becomes a conductive member of a second embodiment of the present invention.
Figure 6:
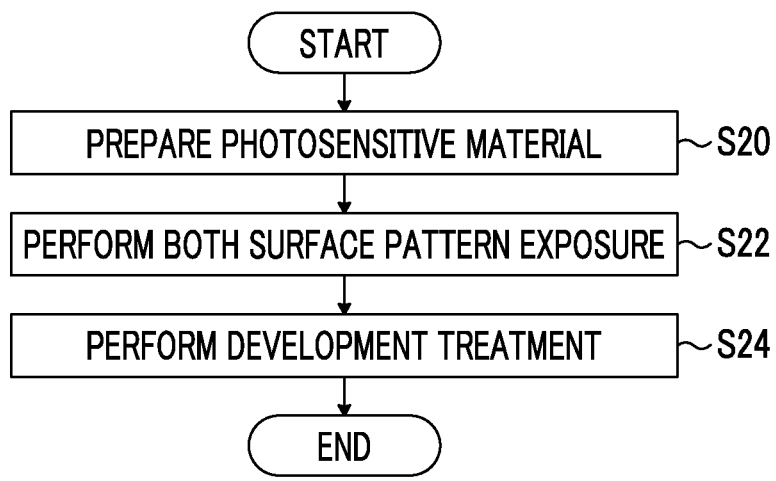
FIG. 6 is a flowchart showing a method for producing a conductive member of the second embodiment of the present invention.
Figure 7A:
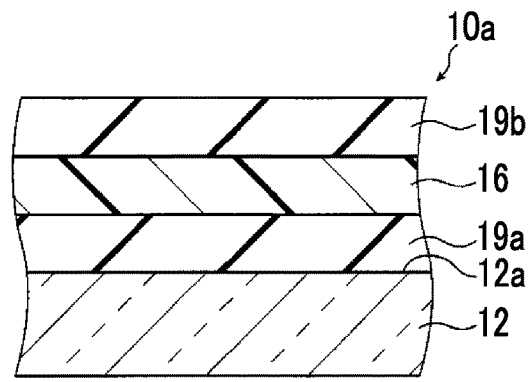
FIGS. 7A to 7C are sectional views schematically showing the method for producing a conductive member of the second embodiment of the present invention.
Figure 7B:
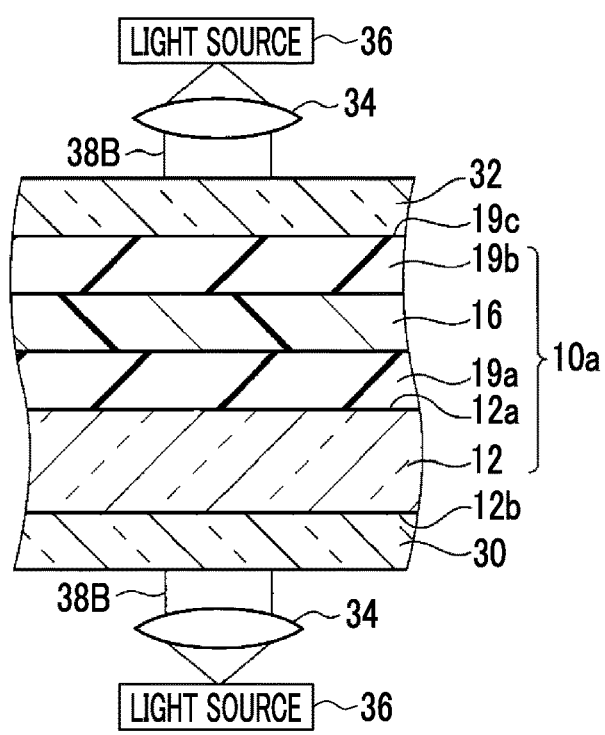
Figure 7C:
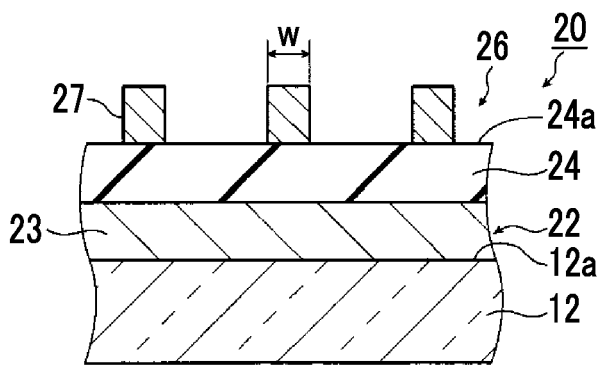

FIG. 5 is a view schematically showing a photosensitive material which becomes a conductive member of a second embodiment of the present invention. FIG. 6 is a flowchart showing a method for producing a conductive member of the second embodiment of the present invention. FIGS. 7A to 7C are sectional views schematically showing the method for producing a conductive member of the second embodiment of the present invention.

In the present embodiment, the photosensitive material 10, the production method, the conductive member 20, and the same configurations of the first embodiment shown in FIGS. 1 to 4 are denoted by the same reference numerals and the detailed description thereof will not be repeated.

In the present embodiment, a photosensitive material 10a shown in FIG. 5 is exposed to light having the same wavelength from both surfaces of the surface 12a side and the rear surface 12b side of the transparent support 12, thereby forming the conductive member 20.

Compared to the photosensitive material 10 (see FIG. 1) of the first embodiment, there is a difference in that the photosensitive material 10a shown in FIG. 5 is a material in which a first silver halide emulsion layer 19a, the light absorption layer 16, and a second silver halide emulsion layer 19b are laminated, in this order, on the surface 12a of the transparent support 12 and the spectral sensitivity of the first silver halide emulsion layer 19a is the same as the spectral sensitivity of the second silver halide emulsion layer 19b. Since other configurations are the same as those of the photosensitive material 10 (see FIG. 1) of the first embodiment, the detailed description thereof will not be repeated.

In the present embodiment, the first silver halide emulsion layer 19a is exposed to light from the rear surface 12b side of the transparent support 12 and the second silver halide emulsion layer 19b is exposed to light from the surface 12a side of the transparent support 12 using different light exposure patterns, and the first conductive layer 22 is formed on the first silver halide emulsion layer 19a on the transparent support 12 side and the second conductive layer 26 is formed on the remaining second silver halide emulsion layer 19b. The first silver halide emulsion layer 19a and the second silver halide emulsion layer 19b are formed by being coated with a photosensitive emulsion coating solution having the same spectral sensitivity.

Both of the first silver halide emulsion layer 19a and the second silver halide emulsion layer 19b have a spectral sensitivity with respect to, for example, B light. For this reason, the first silver halide emulsion layer 19a and the second silver halide emulsion layer 19b can be exposed to light having the same wavelength, that is, B light in this case. As two light sources 36, light sources that apply light having the same wavelength are used. In this case, light sources that apply B light, as exposure light, are sued as the light sources 36.

The light absorption layer 16 absorbs light having a wavelength with the spectral sensitivity of the first silver halide emulsion layer 19a and the second silver halide emulsion layer 19b, that is, B light in this case.

In the method for producing the conductive member 20 of the present embodiment, the photosensitive material 10a is firstly prepared as shown in FIG. 6 (Step S20). The photosensitive material 10a is prepared by forming the first silver halide emulsion layer 19a, the light absorption layer 16, and the second silver halide emulsion layer 19b, in this order, on the surface 12a of the transparent support 12 using a coating method as shown in FIG. 7A. Moreover, when the first silver halide emulsion layer 19a, the light absorption layer 16, and the second silver halide emulsion layer 19b can be formed in this order, the first silver halide emulsion layer 19a, the light absorption layer 16, and the second silver halide emulsion layer 19b may be formed using a multilayer coating method. In this manner, the time for preparing the photosensitive material 10a can be shortened.

Next, as shown in FIG. 6, both surfaces of the photosensitive material 10a are pattern-exposed in order to form a conductive layer (Step S22).

The both surface pattern exposure is performed, as shown in FIG. 7B, by disposing the second photomask 32 in a close contact to the surface 19c of the second silver halide emulsion layer 19b of the photosensitive material 10a and disposing the first photomask 30 in close contact with the rear surface 12b of the transparent support 12.

One light source 36 is disposed to face the first photomask 30 and the other light source 36 is disposed to face the second photomask 32. A collimator lens 34 is disposed between one light source 36 and the first photomask 30 and another collimator lens 34 is disposed between the other light source 36 and the second photomask 32.

Since the first photomask 30 and the second photomask 32 have the same functions and configurations as those of the first embodiment, the detailed description thereof will not be repeated. Further, a gap having a length of 2 μm to 10 μm may be provided between transparent support 12 and the first photomask 30 and a gap having a length of 2 μm to 10 μm may be provided between the second silver halide emulsion layer 19b and the second photomask 32.

When B light 38 is made into parallel light using the collimator lens 34 and the light source 36 irradiates the first photomask 30 with the parallel light, B light carrying the first light exposure pattern reaches the first silver halide emulsion layer 19a and a latent image of the conductive pattern is formed using the first light exposure pattern. When B light 38 is made into parallel light using the collimator lens 34 and the light source 36 irradiates the second photomask 32 with the parallel light, B light carrying the second light exposure pattern reaches the second silver halide emulsion layer 19b and a latent image of the conductive pattern is formed using the second light exposure pattern.

Moreover, since the light absorption layer 16 absorbs B light, the exposed B light does not reach the first silver halide emulsion layer 19a and the second silver halide emulsion layer 19b. In this manner, latent images of separate conductive patterns are respectively formed on the first silver halide emulsion layer 19a and the second silver halide emulsion layer 19b.

Subsequently, after the light exposure, the photosensitive material 10a on which a latent image is formed is subjected to a development treatment (Step S24). In this manner, the conductive member 20 shown in FIG. 7C is formed. Since the conductive member 20 shown in FIG. 7C has the same configuration as that of the conductive member 20 shown in FIG. 3C, the detailed description thereof will not be repeated.

In the conductive member 20, the first conductive layer 22 is a layer in which the thin silver metal wire 23 is formed in a shape of the first conductive pattern after the first silver halide emulsion layer 19a is exposed to light using the first light exposure pattern. The second conductive layer 26 is a layer in which the thin silver metal wire 27 is formed in a shape of the second conductive pattern after the second silver halide emulsion layer 19b is exposed to light using the second light exposure pattern. The electrically insulating layer 24 is configured of the light absorption layer 16.

Moreover, since the light exposure time and the development time of the first silver halide emulsion layer 19a and the second silver halide emulsion layer 19b variously change according to the type of the second light source 36B or the type of a developer, preferable ranges of the numerical values cannot be unconditionally determined, but the light exposure time and the development time are adjusted to a light exposure time and a development time at which the development rate became 100%. The first conductive layer 22 and the second conductive layer 26 may be allowed to carry conductive metals by applying at least one of physical development or a plating treatment to the first conductive layer 22 and the second conductive layer 26.

In the present embodiment, the conductive patterns of the first conductive layer 22 and the second conductive layer 26 can be pattern-exposed by performing one-pass light exposure. In this manner, the number of processes of producing the conductive member 20 can be reduced more than the existing one and the productivity can be improved. In the present embodiment, it is possible to obtain the same effects as those of the first embodiment. The exposure timings of both surfaces of the present embodiment may be the same as or different from each other. The exposure timing can be appropriately set according to the configuration or the like of a device.

In the production of the conductive member 20 of the present embodiment, a sheet type that uses a transparent support 12 with a predetermined size or a roll-to-roll type that uses a long transparent support 12 can be used for both processes of pattern exposure and the development process for preparing the photosensitive material 10a and the conductive member 20.

Next, a third embodiment of the present invention will be described.

Figure 8:
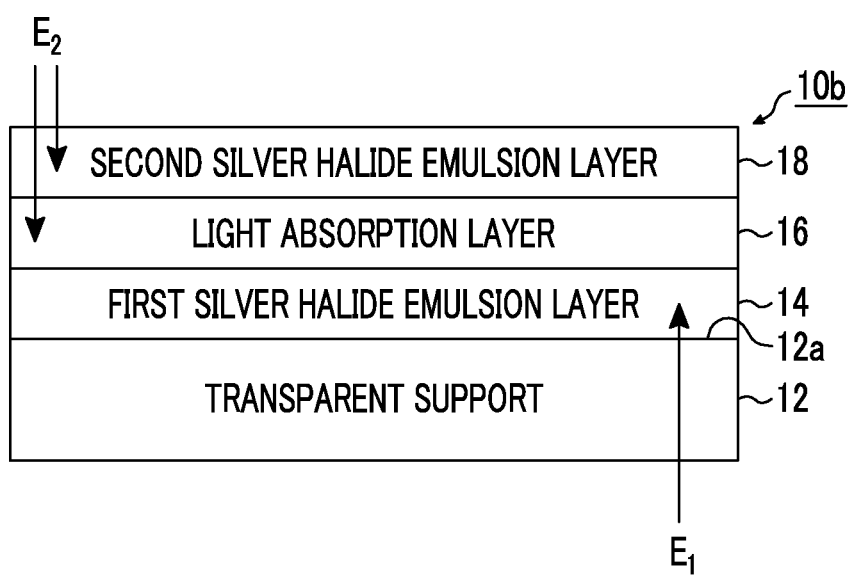
FIG. 8 is a view schematically showing a photosensitive material which becomes a conductive member of a third embodiment of the present invention.
Figure 9A:
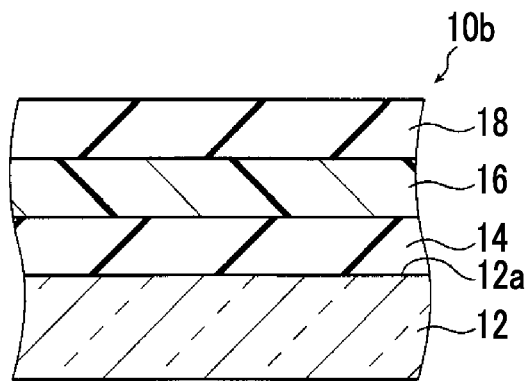
FIGS. 9A to 9C are sectional views schematically showing the method for producing a conductive member of the third embodiment of the present invention.
Figure 9B:
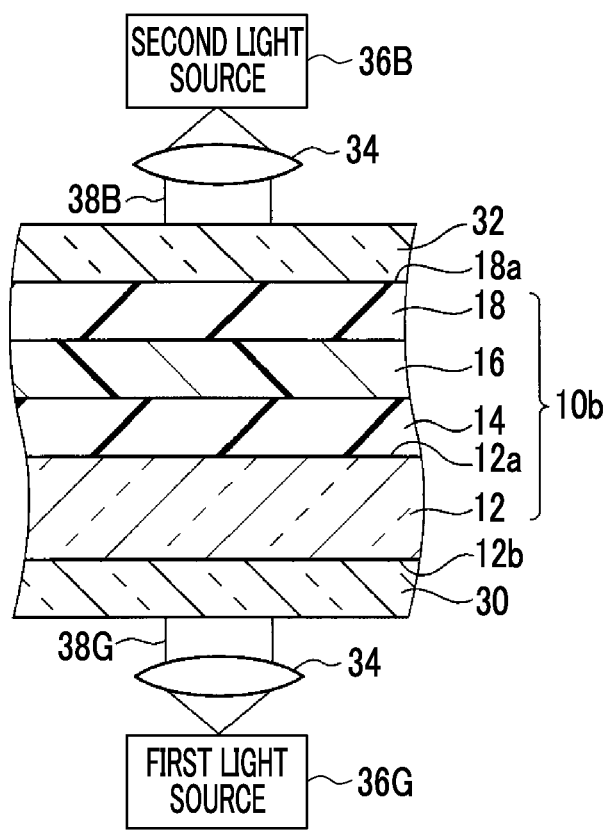
Figure 9C:
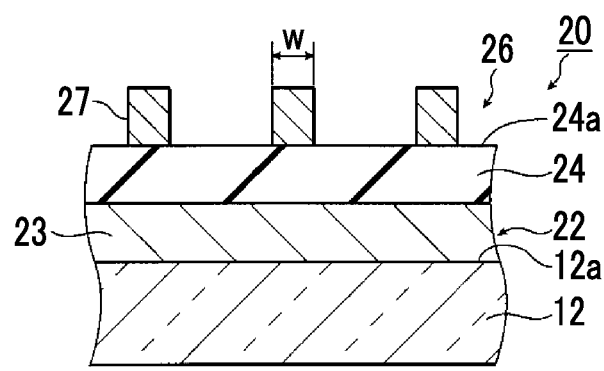

FIG. 8 is a view schematically showing a photosensitive material which becomes a conductive member of a third embodiment of the present invention. FIGS. 9A to 9C are sectional views schematically showing the method for producing a conductive member of the third embodiment of the present invention.

In the present embodiment, the photosensitive material 10, the production method, the conductive member 20, and the same configurations of the first embodiment shown in FIGS. 1 to 4 are denoted by the same reference numerals and the detailed description thereof will not be repeated.

A photosensitive material 10b shown in FIG. 8 has the same configuration as that of the photosensitive material 10 (see FIG. 1) of the first embodiment.

In the present embodiment, the photosensitive material 10b shown in FIG. 8 is exposed to light having different wavelengths from both surfaces of the surface 12a side and the rear surface 12b side of the transparent support 12, thereby forming the conductive member 20. The method for producing the conductive member 20 of the present embodiment is the same as the method for producing the conductive member 20 of the first embodiment shown in FIG. 2 except that both surface pattern exposure is carried out. The method for producing the conductive member 20 of the present embodiment is the same as the method for producing the conductive member 20 of the second embodiment shown in FIG. 6.

The spectral sensitivity of the first silver halide emulsion layer 14 is different from the spectral sensitivity of the second silver halide emulsion layer 18. The first silver halide emulsion layer 14 has a spectral sensitivity with respect to G light and the second silver halide emulsion layer 18 has a spectral sensitivity with respect to B light. Further, the light absorption layer 16 absorbs B light.

In the present embodiment, the photosensitive material 10b is firstly prepared (Step S20 (see FIG. 6)). The photosensitive material 10b is prepared by forming the first silver halide emulsion layer 14, the light absorption layer 16, and the second silver halide emulsion layer 18, in this order, on the surface 12a of the transparent support 12 using a coating method as shown in FIG. 8A. Moreover, when the first silver halide emulsion layer 14, the light absorption layer 16, and the second silver halide emulsion layer 18 can be formed in this order, the first silver halide emulsion layer 14, the light absorption layer 16, and the second silver halide emulsion layer 18 may be formed at the same time using a multilayer coating method. In this manner, the time for preparing the photosensitive material 10b can be shortened.

Next, both surfaces of the photosensitive material 10b are pattern-exposed in order to form a conductive layer (Step S22 (see FIG. 6)).

The both surface pattern exposure is performed, as shown in FIG. 9B, by disposing the second photomask 32 in a close contact to the surface 18a of the second silver halide emulsion layer 18 of the photosensitive material 10b and disposing the first photomask 30 in close contact with the rear surface 12b of the transparent support 12.

The first light source 36G that applies G light 38G is disposed to face the first photomask 30 and the second light source 36B that applies B light 38B is disposed to face the second photomask 32. A collimator lens 34 is disposed between the first light source 36G and the first photomask 30 and another collimator lens 34 is disposed between the second light source 36B and the second photomask 32.

Since the first photomask 30 and the second photomask 32 have the same functions and configurations as those of the first embodiment, the detailed description thereof will not be repeated.

When G light 38G is made into parallel light using the collimator lens 34 and the first light source 36G irradiates the first photomask 30 with the parallel light, G light carrying the first light exposure pattern reaches the first silver halide emulsion layer 14 and a latent image of the conductive pattern is formed using the first light exposure pattern. When B light 38B is made into parallel light using the collimator lens 34 and the second light source 36B irradiates the second photomask 32 with the parallel light, B light carrying the second light exposure pattern reaches the second silver halide emulsion layer 18 and a latent image of the conductive pattern is formed using the second light exposure pattern.

Moreover, since the light absorption layer 16 absorbs B light, the B light does not reach the first silver halide emulsion layer 14. In this manner, latent images of conductive patterns can be formed by exposing the first silver halide emulsion layer 14 and the second silver halide emulsion layer 18 to light.

Subsequently, after the light exposure, the photosensitive material 10b on which a latent image is formed is subjected to a development treatment (Step S24 (see FIG. 6)). In this manner, the conductive member 20 shown in FIG. 9C is formed. Since the conductive member 20 shown in FIG. 9C has the same configuration as that of the conductive member 20 shown in FIG. 3C, the detailed description thereof will not be repeated.

In the present embodiment, the conductive patterns of the first conductive layer 22 and the second conductive layer 26 can be pattern-exposed by performing one-pass light exposure. In this manner, the number of processes of producing the conductive member 20 can be reduced more than the existing one and the productivity can be improved. In the present embodiment, it is possible to obtain the same effects as those of the first embodiment. The exposure timings of both surfaces of the present embodiment may be the same as or different from each other. The exposure timing can be appropriately set according to the configuration or the like of a device.

Moreover, even in the present embodiment, two layers of the first silver halide emulsion layer 14 and the second silver halide emulsion layer 18 are provided as photosensitive layers, but the number of layers is not limited thereto. For example, the number of layers may be three or more. In this case, the absorption wavelength region of the ht absorption layer is appropriately set such that each silver halide emulsion layer is not exposed to light.

In the present embodiment, light having a spectral sensitivity of the first silver halide emulsion layer 14 is set to G light, light having a spectral sensitivity of the second silver halide emulsion layer 18 is set to B light, and the light absorption layer 16 absorbs B light in the same manner as in the first embodiment, but the present invention is not limited thereto. For example, light having a spectral sensitivity of the first silver halide emulsion layer 14 may be set to R light, light having a spectral sensitivity of the second silver halide emulsion layer 18 may be set to B light, and the light absorption layer 16 may absorb B light. Even in the present embodiment, the light absorption layer 16 may absorb any exposure light from among exposure light.

In the production of the conductive member 20 of the present embodiment, a sheet type that uses a transparent support 12 with a predetermined size or a roll-to-roll type that uses a long transparent support 12 can be used for both processes of pattern exposure and the development process for preparing the photosensitive material 10b and the conductive member 20.

Hereinafter, the configurations of the photosensitive materials 10, 10a, and 10b and the conductive member 20 of the present embodiment will be described.

[Transparent Support]

As a transparent support, a plastic film, a plastic plate, and a glass plate can be used.

Examples of raw materials of the above-described plastic film and plastic plate include polyesters such as polyethylene terephthalate (PET) and polyethylene naphthalate (PEN); polyolefins such as polyethylene (PE), polypropylene (PP), polystyrene, and EVA; a vinyl resin; polycarbonate (PC); polyamide; polyimide; an acrylic resin; and triacetyl cellulose (TAC).

Examples of the transparent support include plastic films and plastic plates having a melting point of approximately 290° C. or lower such as PET (melting point of 258° C.), PEN (melting point of 269° C.), a cycloolefin polymer (COP) (melting point of 134° C.), PE (melting point of 135° C.), PP (melting, point of 163° C.), polystyrene (melting point of 230° C.), polyvinyl chloride (melting point of 180° C.), polyvinylidene chloride (melting point of 212° C.), and TAC (melting point of 290° C.). Among these, from the viewpoint of optical transparency or workability, PET is particularly preferable. Since a conductive member for a touch panel needs to have transparency, it is preferable that the transparency of the transparent support is high.

The thickness of the support is not particularly limited, but a support having a thickness of 20 μm to 500 μm can be optionally selected typically from the viewpoint of applications to a touch panel or an electromagnetic wave shield. Further, when the support also has a function of a touch surface in addition to functions of a support of a transparent conductive film, the thickness thereof can be set to greater than 500 μm.

The transparent support used for one surface pattern exposure of the present invention is not particularly limited, and a transparent support having an optional thickness can be designed for use. Meanwhile, in regard to the transparent support used for both surface pattern exposure of the present invention, since the distance between a light source and a silver halide emulsion layer (photosensitive layer) depends on the thickness of the transparent support, it is necessary to select an appropriate optical system in order to obtain a desired light width.

[Silver Halide Emulsion Layer]

The first silver halide emulsion layer and the second silver halide emulsion layer contain additives such as a solvent and a dye in addition to silver salts and a binder.

[Silver Halide Emulsion]

A silver halide for a silver halide emulsion in a silver halide photographic photosensitive material used for an image forming method of the present invention is not particularly limited. For example, silver chloride, silver chlorobromide, silver bromide, silver iodochlorobromide, or silver iodobromide can be used, but silver chlorobromide or silver iodochlorobromide containing 30 mol % or greater of silver chloride is preferable. The shape of silver halide grains may be cubic, tetradecahedral, octahedral, undefined, or plate-like, but a cubic shape is preferable. The average grain size if the silver halide is preferably in a range of 0.02 µm to 0.7 µm and more preferably in a range of 0.02 µm to 0.25 µm. Further, a variation coefficient represented by {(standard deviation of grain size)/(average grain size)}× 100" is preferably 15% or less and more preferably 10% or less with narrow grain size distribution.

A photographic emulsion used in the present invention can be prepared using methods described in Chimie et Physique Photographique (published by Paul Montel, 1967) written by P. Glafkides; Photographic Emulsion Chemistry (published by The Forcal Press, 1966) written by G. F. Dufin; and Making and Coating Photographic Emulsion (published by The Forcal Press, 1964) written by V. L. Zelikman et al.

In other words, any of an acid method, a neutral method, and the like may be used. Further, as a method of reacting soluble silver salts with soluble halogen salts, any of a one side mixing method, a simultaneously mixing method, and a combination of these may be used. A method of forming grains in excessive silver ions, that is, a so-called reverse mixing method can be used.

As one form of the simultaneously mixing method, a method of holding pAg to be constant in a liquid phase, in which a silver halide is generated, that is, a so-called controlled double jet method can be used. It is particularly preferable that grains are formed using a so-called silver halide solvent such as ammonia, thioether, or tetra-substituted thiourea. A tetra-substituted thiourea compound is more preferable as a silver halide solvent and is described in JP1978-82408A (JP-S53-82408A) and JP1980-77737A (JP-S55-77737A). As a thiourea compound, tetramethyl thiourea or 1,3-dimethyl-2-imidazolidinethione is preferable. The amount of the silver halide solvent to be added varies depending on the type of compound to be used, the target grain size, and the halogen composition, but is preferably in a range of $10^{-5}$ mol to $10^{-2}$ mol per 1 mol of a silver halide.

In a grain forming method using the controlled double jet method and the silver halide solvent, a silver halide emulsion with a regular crystal form and narrow grain size distribution can be easily produced and can be used as useful means for producing the silver halide emulsion used in the present invention.

Moreover, in order to make the grain size uniform, it is preferable that grains grow faster within a range not exceeding the critical degree of saturation using a method of changing the addition rate of silver nitrate or an alkali halide according to the grain growth rate as described in UK Patent No. 1535016, JP1973-36890B (JP-S48-36890B), and JP1977-16364B (JP-S52-16364B) or a method of changing the concentration of an aqueous solution described in UK Patent No. 4242445 and JP1980-158124B (JP-S55-158124B).

It is preferable that the silver halide emulsion used in the present invention contains $1 \times 10^{-6}$ mol or greater of a metal complex having one or more cyanide ligands in the silver halide per 1 mol of silver. It is more preferable that the silver halide emulsion contains $5 \times 10^{-6}$ mol to $1 \times 10^{-2}$ mol of a metal complex having in the silver halide per 1 mol of silver. The metal complex having one or more cyanide ligands used in the present invention is added in the form of a water-soluble complex salt. A six-coordinate complex represented by the following formula is particularly preferable.

$[M(CN)_{n1}L_{6-n1}]^{n-}$

Here, M represents a metal belonging to V to VIII groups, and Ru, Re, Os, or Fe is particularly preferable. L represents a ligand other than a cyan compound, and a halide ligand, a nitrosyl ligand, or a thionitrosyl ligand is preferable. n1 represents 1 to 6, and n represents 0, 1, 2, 3, or 4. It is preferable that n1 represents 6. In this case, a counter ion has not importance and an ammonium ion or an alkali metal ion is used. Specific examples of a complex used in the present invention are described below, but the complexes which can be used in the present invention are not limited thereto.

$[Re(NO)(CN)_5]^{2-}$
$[Re(O)_2(CN)_4]^{3-}$
$[Os(NO)(CN)_5]^{2-}$
$[Os(CN)_6]^{4-}$
$[Os(O)_2(CN)_4]^{4-}$
$[Ru(CN)_6]^{4-}$
$[Fe(CN)_6]^{4-}$

The metal complex used in the present invention may be present in any place of silver halide grains, but it is preferable that the metal complex is present in the inside of a silver halide crystal. It is most preferable that the metal complex is present in the inside of each silver halide crystal in which silver is contained at a content of 99 mol % or less, preferably 95 mol % or less, and more preferably 0 mol % to 95 mol %. For this, as described in examples described below, it is preferable that photosensitive silver halide grains in a multilayer manner.

For the purpose of achieving a high contrast and low fogging, it is preferable that the silver halide emulsion used in the present invention contains a rhodium compound, an iridium compound, a rhenium compound, a ruthenium compound, and an osminum compound in addition to a metal complex that contains one or more cyan compound ligands.

As a rhodium compound used in the present invention, a water-soluble rhodium compound can be used. Examples thereof include a rhodium halide (III) compound; and a rhodium complex salt, including halogen, aminos, oxalato, or aquo as a ligand, such as a hexachlororhodium (III) complex salt, a pentachloroaquorhodium complex salt, a tetrachlorodiaquorhodium complex salt, a hexabromorhodium (III) complex salt, a hexamine rhodium (III) complex salt, or a trioxalato rhodium (III) complex salt. These rhodium compounds can be used by being dissolved in water or a suitable solvent, but a method which is usually used to stabilize a solution of a rhodium compound, that is, a method of adding a hydrogen halide aqueous solution (for example, hydrochloric acid, hydrobromic acid, or hydrofluoric acid) or an alkali halide (for example, KCl, NaCl, KBr, NaBr) can be used. In place of using water-soluble rhodium, other silver halide grains in a state in which rhodium is doped in advance can be added and for dissolution at the time of preparing a silver halide.

The rhenium, ruthenium, and osmium used in the present invention are added in the form of a water-soluble complex described in JP1988-2042A (JP-S63-2042A), JP1989-285941A (JP-H01-285941A), JP1990-20852A (JP-H02-

20852A), and JP1990-20855A (JP-H02-20855A). A six-coordinate complex represented by the following formula is particularly preferable.

$[ML_6]^{n-}$

Here, M represents Ru, Re, or Os, L represents a ligand, and n represents 1, 2, 3, or 4. In this case, a counter ion does not have importance and an ammonium ion or an alkali metal ion is used. Preferred examples of the ligand include a halide ligand, a nitrosyl ligand, and a thionitrosyl ligand. Specific examples of a complex used in the present invention are described below, but the complexes which can be used in the present invention are not limited thereto.

$[ReCl_6]^{3-}$
$[ReBr_6]^{3-}$
$[ReCl_5(NO)]^{2-}$
$[Re(NS)Br_5]^{2-}$
$[RuCl_6]^{3-}$
$[RuCl_4(H_2O)_2]^{1-}$
$[RuCl_5(NO)]^{2-}$
$[RuBr_5(NS)]^{2-}$
$[Ru(CO)_3Cl_3]^{2-}$
$[Ru(CO)Cl_5]^{2-}$
$[Ru(CO)Br_5]^{2-}$
$[OsCl_6]^{3-}$
$[OsCl_5(NO)]^{2-}$
$[Os(NS)Br_5]^{2-}$

The addition amount of these compounds is preferably in a range of $1\times10^{-9}$ mol to $1\times10^{-5}$ mol and particularly preferably in a range of $1\times10^{-8}$ mol to $1\times10^{-6}$ mol per 1 mol of a silver halide. Examples of the iridium compound used in the present invention include hexachloroiridium, hexabromoiridium, hexaammine iridium, and pentachloronitrosyl iridium.

(Chemical Sensitization)

It is preferable that the silver halide emulsion used in the present invention is chemically sensitized. Known methods such as a sulfur sensitization method, a selenium sensitization method, a tellurium sensitization method, and a noble metal sensitization method can be used, and these methods can be used alone or in combination. In a case where these methods are used in combination, for example, a combination of a sulfur sensitization method and a gold sensitization method, a combination of a sulfur sensitization method, a selenium sensitization method, and a gold sensitization method, or a combination of a sulfur sensitization method and a tellurium sensitization method is preferable.

The sulfur sensitization used in the present invention is typically performed by adding a sulfur sensitizer and stirring an emulsion at a high temperature of 40° C. or higher for a certain period of time. A known compound can be used as the sulfur sensitizer, and examples thereof include various sulfur compounds such as thiosulfate, thioureas, thiazoles, and rhodanines in addition to a sulfur compound included in gelatin. As a sulfur compound, thiosulfate or a thiourea compound is preferable. As a thiourea compound, a specific tetra-substituted thiourea compound described in U.S. Pat. No. 4,810,626A is particularly preferable. The addition amount of a sulfur sensitizer changes under various conditions of the pH and the temperature at the time of chemical ripening, and the size of the silver halide grains, but is preferably in a range of $10^{-7}$ mol to $10^{-2}$ mole and more preferably in a range of $10^{-5}$ mol to $10^{-3}$ mol per 1 mol of a silver halide.

As the selenium sensitizer used in the present invention, a known selenium compound can be used. That is, typically, a labile and/or non-labile selenium compound is added and the emulsion is stirred at a high temperature of 40° C. or higher for a certain period of time. As the non-liable selenium compound, compounds described in JP1969-15748B (JP-S44-15748B), JP1968-13489B (JP-S43-13489B), JP 1992-109240A (JP-H04-109240A), and JP1992-324855A (JP-H04-324855A). It is particularly preferable to use compounds represented by Formula (VIII) and (IX) in JP1992-324855A (JP-H04-324855A).

The tellurium sensitizer used in the present invention is a compound which can generate silver telluride, which is assumed to become a sensitizing nucleus, on the surface or in the inside of silver halide grains. The generation rate of silver telluride in the silver halide emulsion can be tested using a method described in JP 1993-313284A (JP-H05-313284A).

Specifically, compounds described in U.S. Pat. No. 1,623,499A, U.S. Pat. No. 3,320,069A, U.S. Pat. No. 3,772,031A, UK Patent No. 235211, UK Patent No. 1121496, UK Patent No. 1295462, UK Patent No. 1396696, CA Patent No. 800958, JP1992-204640A (JP-H04-204640A), JP 1992-271341A (JP-H04-271341A), JP1992-333043A (JP-H04-333043A), JP1993-303157A (JP-H05-303157), Journal of Chemical Society Chemical Community (J. Chem. Soc. Chem. Commun.) 635(1980), ibid 1102 (1979), ibid 645 (1979), Journal of Chemical Society Perkin Transaction (J. Chem. Soc, Perkin. Trans.) 1, 2191 (1980), edited by S Patai, The Chemistry of Organic Selenium and Tellunium Compounds, Vol. 1 (1986), and The Chemistry of Organic Selenium and Tellunium Compounds, Vol. 2 (1987) can be used. Compounds represented by Formula e (II), (III), and (IV) described in JP1992-324855A (JP-H04-324855A) are particularly preferable.

The use amount of the selenium sensitizer and the tellurium sensitizer used in the present invention varies depending on the silver halide grains to be used or the conditions of chemical ripening, but is typically in a range of $10^{-8}$ mol to $10^{-2}$ mol, and preferably in a range of $10^{-7}$ mol to $10^{-3}$ mol per 1 mol of a silver halide. The conditions of chemical sensitization of the present invention are not particularly limited, but the pH thereof is in a range of 5 to 8, pAg is in a range of 6 to 11 and preferably in a range of 7 to 10, and the temperature thereof is in a range of 40° C. to 95° C. and preferably in a range of 45° C. to 85° C.

Examples of the noble metal sensitizer used in the present invention include gold, platinum, palladium, and iridium. Among these, gold sensitizer is particularly preferable. Specific examples of the gold sensitizer used in the present invention include chloroauric acid, potassium chloroaurate, potassium aurithiocyanate, and gold sulfide. Further, the use amount of the gold sensitizer is in a range of $10^{-7}$ mol to $10^{-2}$ mol per 1 mol of a silver halide.

In the process of forming silver halide grains or physical ripening, cadmium salts, sulfite, lead salts, or thallium salts may coexist with the silver halide emulsion used in the present invention.

In the present invention, reduction sensitization can be used. As a reduction sensitizer, stannous salts, amines, formamidinesulfinic acid, or a silane compound can be used.

A thiosulfonic acid compound may be added to the silver halide emulsion used in the present invention using a method described in EP293917A.

It is preferable that one to three kinds of silver halide emulsions are used for the silver halide photographic photosensitive material of the present invention. In a case of using a combination of two or more kinds thereof, it is preferable to use a combination of silver halide agents having different average grain sizes, a combination of silver halide agents having different halogen compositions, a combination of silver halide agents having different amounts and types of metal complexes to be contained, a combination of silver halide agents having different crystal habits, a combination of silver halide agents having different conditions of chemical sensitization, or a combination of silver halide agents having different sensitivities. In order to obtain a high contrast, as described in JP1994-324426A (JP-H06-324426A), it is preferable to apply an emulsion having a high sensitivity close to that of a support.

(Sensitizing Dye)

A photosensitive silver halide emulsion may be spectrally sensitized, by a sensitizing dye, to blue light, green light, red light, or infrared light having a relatively long wavelength.

A silver halide emulsion contained in a first silver halide emulsion layer may be spectrally sensitized to a wavelength region of 500 nm or greater.

At this time, it is preferable that a silver halide emulsion contained in a second silver halide emulsion layer is spectrally sensitized to a wavelength region different from the spectral sensitization region of the silver halide emulsion contained in the first silver halide emulsion layer. Specifically, it is preferable that the silver halide emulsion contained in the second silver halide emulsion layer does not have a spectral sensitivity at a wavelength region of 500 nm or greater.

The formation of different conductive patterns on the first silver halide emulsion layer and the second silver halide emulsion layer having spectral sensitivities different from each other is realized by irradiating the first silver halide emulsion layer with light having a wavelength of 500 nm or greater and irradiating the second silver halide emulsion layer with light having a wavelength of less than 500 nm. Among light having a wavelength of less than 500 nm applied to the second silver halide emulsion layer, light passing through the second silver halide emulsion layer does not substantially reach the first silver halide emulsion layer by adjusting the amount of a solid dispersion dye contained in the light absorption layer disposed on the first silver halide emulsion layer.

As the sensitizing dye which can be used in the present invention, a compound represented by Formula [I] described in JP1980-45015A (JP-S55-45015A), a compound represented by Formula [I] described in JP1997-160185A (JP-H09-160185A), and compounds represented by Formulae (A) and (B) described in JP2008-107776A are preferable. Among these, compounds represented by Formulae (A) and (B) described in JP2008-107776A are particularly preferable. Specific examples thereof include compounds (1) to (19) described in JP1980-45015A (JP-S55-45015A), compounds I-1 to I-40 and compounds I-56 to I-85 described in JP1997-160185A (JP-H09-160185A), and compounds ExS-1 to ExS-14 described in JP2008-107776A.

Examples of the infrared sensitizing dye include compounds I-1 to I-67 described in JP 1997-34078A (JP-H09-34078A).

Examples of other sensitizing dyes include a cyanine dye, a merocyanine dye, a complex cyanine dye, a complex merocyanine dye, a holopolar cyanine dye, a styryl dye, a hemicyanine dye, an oxonol dye, and a hemioxonol dye.

Other useful sensitizing dyes used in the present invention are described in literatures described or cited in RESEARCH DISCLOSURE Item 17643IV-A section (December 1978, p. 23) and RESEARCH DISCLOSURE Item 18341X section (August 1979, p. 437).

Sensitizing dyes having spectral sensitivities particularly suitable for spectral characteristics of various laser light sources can be advantageously selected.

For example, with respect to an argon laser light source (A), compounds (I)-1 to (I)-8 described in JP1985-162247A (JP-S60-162247A), compounds I-1 to I-28 described in JP1990-48653A (JP-H02-48653A), compounds I-1 to I-13 described in JP1992-330434A (JP-H04-330434A), compounds shown in Examples 1 to 14 described in U.S. Pat. No. 2,161,331A, and compounds 1 to 7 described in DD Patent No. 936071 can be advantageously selected. With respect to a helium-neon laser light source (B), compounds I-1 to I-38 described in JP1979-18726A (JP-S54-18726A), compounds I-1 to I-35 described in JP1994-75322A (JP-S6-75322A), and compounds I-1 to I-34 described in JP1995-287338A (JP-S7-287338A) can be advantageously selected. With respect to an LED light source (C), dyes 1 to 20 described in JP1980-39818B (JP-S55-39818B), compounds I-1 to I-37 described in 1987-284343A (JP-S62-284343A), and compounds I-1 to I-34 described in JP1995-287338A (JP-H07-287338A) can be advantageously selected. With respect to a semiconductor laser light source (D), compounds I-1 to I-12 described in JP1984-191032A (JP-S59-191032A), compounds I-1 to I-22 described in JP1985-80841A (JP-S60-80841A), compounds I-1 to I-29 described in JP1992-335342A (JP-H04-335342A), compounds I-1 to I-18 described in JP1984-192242A (JP59-192242A) can be advantageously selected. With respect to a tungsten light source and a xenon light source (E), compounds I-41 to I-55 and compounds I-86 to I-97 described in JP1997-160185A (JP-09-160185A), and compounds 4-A to 4-S, compounds 5-A to 5-Q, and compounds 6-A to 6-T described in JP1994-242547A (JP-H06-242547A), in addition to the compounds described above, can be advantageously selected.

These sensitizing dyes may be used alone or in combination thereof. Particularly, a combination of sensitizing dyes is occasionally used for the purpose of super sensitization. The emulsion may include a sensitization dye, a dye which does not show a spectral sensitization action, or a substance which does not substantially absorb visible light and shows supersensitization.

Useful sensitizing dyes, combinations of dyes showing supersensitization, and substances showing supersensitization are described in Research Disclosure Vol. 176, 17643 (published on December 1978), Section J in IV p. 23, or JP 1974-25500A (JP-S49-25500A), JP 1968-4933A (JP-S43-4933A), JP 1984-19032A (JP-S59-19032A), and JP1984-192242A (JP-S59-192242A) described above.

A combination of two or more kinds of sensitizing dyes used in the present invention may be used. In order to add sensitizing dyes to a silver halide emulsion, these sensitizing dyes may be directly dispersed in the emulsion or these sensitizing dyes may be added to the emulsion by being dissolved in a single solvent or a mixed solvent of water, methanol, ethanol, propanol, acetone, methyl cellosolve, 2,2,3,3,-tetrafluoropropanol, 2,2,2-trifluoroethanol, 3-methoxy-1-propanol, 3-methoxy-1-butanol, 1-methoxy-2-propanol, or N,N-dimethylformamide.

Further, a method of dissolving a dye in a volatile organic solvent, dispersing this solution in water or a hydrophilic colloid, and adding this dispersion to an emulsion as disclosed in U.S. Pat. No. 3,469,987A; a method of dissolving a dye in an acid and adding this solution to an emulsion or allowing an acid or a hydrochloric group to coexist and adding this aqueous solution to an emulsion as disclosed in JP1969-23389B (JP-S44-23389B), JP1969-27555B (JP-S44-27555B), and JP1982-22091B (JP-S57-22091B); a method of allowing a surfactant to coexist to obtain an aqueous solution or a colloid dispersion and adding the aqueous solution or the colloid dispersion in an emulsion as disclosed in U.S. Pat. No. 3,822,135A and U.S. Pat. No. 4,006,025A; a method of dispersing a dye directly in a hydrophilic colloid and adding this dispersion to an emulsion as disclosed in JP1978-102733A (JP-S53-102733A) and JP1983-105141A (JP-S58-105141A); and a method of dissolving a dye using a compound to be red-shifted and adding this solution to an emulsion as disclosed in JP1976-74624A (JP-S51-74624A) can be used. Moreover, ultrasonic waves can be used for a solution.

The timing for adding a sensitizing dye used in the present invention to a silver halide emulsion may be any moment during a process of preparing an emulsion which has been recognized to be useful. For example, a sensitizing dye may be added at the timing of a process of forming silver halide grains and/or before desalting or at the timing of a desilvering process and/or a period before initiation of chemical ripening after desalting as disclosed in U.S. Pat. Nos. 2,735,766A, 3,628,960A, 4,183,756A, 4,225,666A, JP1983-184142A (JP-S58-184142A), and JP1985-196749A (JP-S60-196749A); at the timing of immediately before chemical ripening or during the process, after chemical ripening, or at any timing before application of the emulsion as disclosed in JP1983-113820A (JP-S58-113920A). Moreover, as disclosed in U.S. Pat. No. 4,225,666A and JP1983-7629A (JP-S58-7629A), the same compound or a combination of different kinds of compounds may be divided and added several times, for example, during the grain forming process, during the chemical ripening process, and after the completion of the chemical ripening or before the chemical ripening, during the process of chemical ripening, and the completion of chemical ripening. The type of the compound or combination of compounds to be divided and added may be changed.

The addition amount of the sensitizing dye of the present invention varies depending on the shape and the size of silver halide grains, the halide composition, the method and degree of chemical sensitization, and the type of antifoggant, but the sensitizing dye can be used at an amount of $4 \times 10^{-6}$ mol to $8 \times 10^{-3}$ mol per 1 mol of a silver halide. For example, in a case where the size of silver halide grains is in a range of 0.2 µm to 1.3 µm, the addition amount thereof is preferably in a range of $2 \times 10^{-7}$ mol to $3.5 \times 10^{-6}$ mol and more preferably in a range of $6.5 \times 10^{-7}$ mol to $2.0 \times 10^{-6}$ mol per 1 $m^2$ of the surface area of the silver halide grains.

(Binder)

Examples of the binder used in the present embodiment include polysaccharides such as gelatin, polyvinyl alcohol (PVA), polyvinyl pyrrolidone (PVP), and starch, cellulose and a derivative thereof, polyethylene oxide, polyvinylamine, chitosan, polylysine, polyacrylic acid, polyalginic acid, polyhyaluronic acid, and carboxy cellulose. These binders have neutral, anionic, and cationic properties due to ionicity of a functional group.

The content of the binder contained in the photosensitive silver halide emulsion layer of the present embodiment is not particularly limited and can be suitably determined within a range capable of exhibiting dispersibility and adhesiveness. The content of the binder in the photosensitive silver halide emulsion layer is, on a silver/binder volume ratio basis, preferably 1/4 or greater and more preferably 1/2 or greater. The silver/binder volume ratio is preferably 100/1 or less and more preferably 50/1 or less. Further, the silver/binder volume ratio is still more preferably in a range of 1/1 to 4/1 and most preferably in a range of 1/1 to 3/1. When the silver/binder volume ratio of the photosensitive silver halide emulsion layer is set to be in the above-described range, a variation in electrical resistivity is suppressed even in a case where the coating amount of silver is adjusted and thus a conductive member for a touch panel having uniform surface resistance can be obtained. Moreover, the silver/binder volume ratio can be acquired by converting the amount of silver halide/amount of binder (weight ratio) of raw materials to the amount of silver/amount of binder (weight ratio) and further converting the amount of silver/amount of binder (weight ratio) to the amount of silver/amount of binder (weight ratio).

<Pigment: Light-Absorbing Dye>

As a light-absorbing dye (pigment) to be added to the photosensitive silver halide emulsion layer or the light absorption layer, a compound represented by the following Formula (A) can be used. This light-absorbing dye (pigment) has an absorption maximum in a wavelength region of 300 nm to 450 nm and absorbs B light.

$$Q1\text{-}X\text{-}Q2 \qquad \text{Formula (A)}$$

In Formula (A), Q1 and Q2 represent a heteroring, —C(CN)$_2$—, —C(CN)CO—Y, —C(CO—Y)SO$_2$—Y, a benzene ring having a hydroxyl group, an alkoxy group, a sulfonic acid group, an alkylsulfonic acid group, an alkoxysulfonic acid group, —N(alkyl)alkylsulfonic acid, or —N(alkyl)$_2$, as a substituent, or a benzene ring which does not have a substituent. Y represents a hydroxyl group, —NHPh, or -Ph. Ph may not have a substituent. X represents —CO— or —NH— as a divalent linking group; —C=, —N=, or —CH= as a trivalent linking group, or a linking group formed by combining these. The linking groups may be bonded to each other and form a 5- or 6-membered ring.

Specifically, compounds represented by Formulae (D-a) to (D-d) shown in the sixth line in the upper left section on page 11 to the fourth line from the bottom in the lower right section on the same page of JP1990-294638A (JP-H02-294638A) can be used. More specifically, compounds represented D-1 to D23 on pages 12 and 13 of JP1990-294638A (JP-H02-294638A) can be used. In this case, among the compounds represented by D-1 to D23, some of the compounds can be fixed to the photosensitive silver halide emulsion layer or the light absorption layer using a mordant and some of the compounds can be fixed thereto as a solid dispersion dye. In addition, a solid fine particle dispersion of a dye represented by Formula (I) in claim 1 of JP2007-199703A can be used. The dye represented by Formula (I) is disclosed in paragraphs [0024] to [0071] of JP2007-199703A and similar desired dyes can be used.

That is, a compound represented by the following Formula (I) is the above-descried desired dye.

$$D\text{-}(X)_y \qquad \text{Formula (I)}$$

In Formula (I), D represents a compound residue having a chromophore, X represents a dissociable hydrogen atom or a group having dissociable hydrogen atoms, and y represents an integer of 1 to 7. Here, when y represents an integer of 2 to 7, a plurality of X's may be the same as or different from each other.

The compound (dye) represented by Formula (I) has a characteristic in which dissociable hydrogen is included in a molecular structure. The compound residue having a chromophore in D can be selected from various known dyes. Examples of these compounds include an oxonol dye, a merocyanine dye, a cyanine dye, an arylidene dye, an azomethine dye, a triphenylmethane dye, an azo dye, an anthraquinone dye, and an indoaniline dye.

X represents dissociable hydrogen bonded to D, directly or through a divalent linking group, or a group having dissociable hydrogen. Examples of the divalent linking group between X and D include an alkylene group, an arylene group, a heterocyclic residue, —CO—, —SO$_n$— (n represents 0, 1, or 2), —NR'— (R' represents a hydrogen atom, an alkyl group, or an aryl group), —O—, and a divalent group formed by combining these linking groups. Further, these groups may include substituents such as an alkyl group, an aryl group, an alkoxy group, an amino group, an acylamino group, a halogen atom, a hydroxyl group, a carboxy group, a sulfamoyl group, a carbamoyl group, and a sulfonamide group. Preferred examples thereof include —(CH$_2$)$_n$'— (n'=1, 2, 3), —CH$_2$CH(CH$_3$)CH$_2$—, 1,2-phenylene, 5-carboxy-1,3-phenylene, 1,4-phenylene, 6-methoxy-1,3-phenylene, and —CONHC$_6$H$_4$—.

The dissociable hydrogen represented by X or the group having dissociable hydrogen has characteristics in which the dissociable hydrogen or the group is non-dissociable and makes the dye represented by Formula (I) substantially water-insoluble in a state in which a dye represented by Formula (I) is added to the silver halide photographic photosensitive material and also has characteristics in which the dissociable hydrogen or the group is dissociated and makes the compound represented by Formula (I) substantially water-soluble during the process in which the photosensitive material is subjected to a development treatment. Examples of the group having dissociable hydrogen represented by X include groups having a carboxylic acid group, a sulfonamide group, a sulfamoyl group, a sulfonylcarbamoyl group, an acylsulfamoyl group, or a phenolic hydroxyl group. Examples of the dissociable hydrogen represented by X include hydrogen of an enol group of an oxonol dye.

y represents an integer of preferably 1 to 5 and particularly preferably 1 to 3.

Among the compounds represented by Formula (I), groups, having dissociable hydrogen represented by X, which are groups having a carboxylic acid group are preferable and compounds having an aryl group substituted with a carboxyl group are particularly preferable.

Further, among the compounds represented by Formula (I), compounds represented by the following Formula (II) or Formula (III) are more preferable.

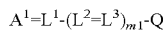   Formula (II)

In Formula (II), A$^1$ represents an acidic nucleus, Q represents an aryl group or a heterocyclic group, L$^1$, L$^2$, and L$^3$ respectively represent a methyl group, and m1 represents 0, 1, or 2. In this case, a compound represented by Formula (II) includes 1 to 7 groups, as aqueous groups in molecules, selected from the group consisting of a carboxylic acid group, a sulfonamide group, a sulfamoyl group, a sulfonylcarbamoyl group, an acylsulfamoyl group, a phenolic hydroxyl group, and an enol group of an oxonol dye.

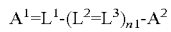   Formula (III)

In Formula (III), A$^1$ and A$^2$ represent an acidic nucleus, L$^1$, L$^2$, and L$^3$ respectively represent a methyl group, and n1 represents 0, 1, 2, or 3. In this case, a compound represented by Formula (III) includes 1 to 7 groups, as aqueous groups in molecules, selected from the group consisting of a carboxylic acid group, a sulfonamide group, a sulfamoyl group, a sulfonylcarbamoyl group, an acylsulfamoyl group, a phenolic hydroxyl group, and an enol group of an oxonol dye.

Hereinafter, Formulae (II) and (III) will be described in detail.

As the acidic nucleus represented by A$^1$ and A$^2$, an acidic nucleus derived from a compound having a methylene group sandwiched by a cyclic ketomethylene compound or an electron withdrawing group is preferable. Examples of the cyclic ketomethylene compound include 2-pyrazoline-5-one, rhodanine, hydantoin, thiohydantoin, 2,4-oxazolidinedione, isoxazolone, barbituric acid, thiobarbituric acid, indandione, dioxopyrazolopyridine, hydroxypyridone, pyrazolidinedione, and 2,5-dihydrofuran. These may include a substituent.

A compound having a methylene group sandwiched by an electron withdrawing group can be represented by Z$^1$CH$_2$Z$^2$. Z$^1$ and Z$^2$ respectively represent —CN, —SO$_2$R$^{11}$, —COR$^{11}$, —COOR$^{12}$, —CONHR$^{12}$, —SO$_2$NHR$^{12}$, or —C[=C(CN)$_2$]R$^{11}$. R$^{11}$ represents an alkyl group, an aryl group, or a heterocyclic group. R$^{12}$ represents a hydrogen atom or a group represented by R$^{11}$. Further, these groups may include a substituent.

Examples of the aryl group represented by Q include a phenyl group and a naphthyl group. These groups may include a substituent. Examples of the heterocyclic group represented by Q include pyrrole, indole, furan, thiophene, imidazole, pyrazole, indolizine, quinolone, carbazole, phenothiazine, phenoxazine, indoline, thiazole, pyridine, pyridazine, thiadiazine, pyran, thiopyran, oxodiazole, benzoquinoline, thiadiazole, pyrrolothiazole, pyrrolopyridazine, tetrazole, oxazole, coumarin, and coumarone. These may respectively include a substituent.

The methane groups represented by L', L$^2$, and L$^3$ may include substituents, and the substituents may be linked to each other and form a 5- or 6-membered ring (for example, cyclopentene or cyclohexene).

The substituents which may be included in the above-described respective groups are not particularly limited unless the substituents substantially dissolve compounds represented by Formulae (I) to (III) in water having a pH of 5 to 7. The following substituents may be exemplified.

The examples thereof include a carboxylic acid group, a sulfonamide group having 1 to 10 carbon atoms (such as methanesulfonamide, benzenesulfonamide, butanesulfoneamide, or n-octanesulfonamide), an unsubstituted-sulfamoyl group or an alkyl- or aryl-substituted sulfamoyl group having 0 to 10 carbon atoms (such as unsubstituted sulfamoyl, methylsulfamoyl, phenylsulfamol, naphthylsulfamoyl, or butylsulfamoyl), a sulfonylcarbamoyl group having 2 to 10 carbon atoms (such as methanesulfonylcarbamoyl, propanesulfonylcarbamoyl, or benzenesulfonylcarbamoyl), an acylsulfamoyl group having 1 to 10 carbon atoms (such as acetylsulfamoyl, propionylsulfamoyl, pivaloylsulfamoyl, or benzoylsulfamoyl), a chain or cyclic alkyl group having 1 to 8 carbon atoms (such as methyl, ethyl, isopropyl, butyl, hexyl, cyclopropyl, cyclopentyl, cyclohexyl, 2-hydroxyethyl, 4-carboxybutyl, 2-methoxyethyl, benzyl, phenethyl, 4-carboxybenzyl, or 2-diethylaminoethyl), an alkenyl group having 2 to 8 carbon atoms (such as vinyl or allyl), an alkoxy group having 1 to 8 carbon atoms (such as methoxy, ethoxy, or butoxy), a halogen atom (such as F, Cl, or Br), an amino group having 0 to 10 carbon atoms (such as unsubstituted amino, dimethylamino, diethylamino, or carboxyethylamino), an ester group having 2 to 10 carbon atoms (such as methoxycarbonyl), an amide group having 1 to 10 carbon atoms (such as acetylamino or benzamide), a carbamoyl group having 1 to 10 carbon atoms (such as unsubstituted carbamoyl, methylcarbamoyl, or ethylcarbamoyl), an aryl group having 6 to 10 carbon atoms (such as phenyl, naphthyl, hydroxyphenyl, 4-carboxyphenyl, 3-carboxyphenyl, 3,5-dicarboxyphenyl, 4-methanesulfonamidephenyl, or 4-butanesulfonamidephenyl), an aryloxy group having 6 to 10 carbon atoms (such as phenoxy, 4-carboxyphenoxy, 3-methylphenoxy, or naphthoxy), an alkylthio group having 1 to 8 carbon atoms (such as methylthio, ethylthio, or octylthio), an arylthio group having 6 to 10 carbon atoms (such as phenylthio or naphthylthio), an acyl group having 1 to 10 carbon atoms (such as acetyl, benzoyl, or propanoyl), a sulfonyl group having 1 to 10 carbon atoms (such as methanesulfonyl or benzenesulfonyl), an ureido group having 1 to 10 carbon atoms (such as ureido or methylureido), an urethane group having 2 to 10 carbon atoms (such as methoxycarbonylamino or ethoxycarbonylamino), a cyano group, a hydroxyl group, a nitro group, and a heterocyclic group (such as a 5-carboxybenzoxazole ring, a pyridine ring, a sulfolane ring, a pyrrole ring, a pyrrolidine ring, a morpholine ring, a piperazine ring, a pyrimidine ring, or a furan ring).

The amount of the solid dispersion dye to be applied to the light absorption layer is preferably in a range of 200 mg/m$^2$ to 1,500 mg/m$^2$ and more preferably in a range of 500 mg/m$^2$ to 1,200 mg/m$^2$. In a case where the amount thereof is less than 200 mg/m$^2$, the layer does not have sufficient light absorption ability. In a case where the amount thereof is greater than 1,500 mg/m$^2$, decolorization becomes insufficient when the development treatment is carried out for a prescribed time and a degradation in transmittance is seen.

(Solvent)

A solvent used to form the photosensitive silver halide emulsion layer is not particularly limited, and examples thereof include water, an organic solvent (for example, alcohols such as methanol; ketones such as acetone; amides such as formamide; sulfoxides such as dimethyl sulfoxide; esters such as ethyl acetate, or ethers); an ionic liquid, and a mixed solvent of these.

The content of the solvent used to form the photosensitive silver halide emulsion layer of the present embodiment is in a range of 30% by mass to 90% by mass and preferably in a range of 50% by mass to 80% by mass with respect to the total mass of silver salts, a binder, and the like included in the photosensitive silver halide emulsion layer.

(Other Additives)

Various additives used in the present embodiment are not particularly limited, and known additives can be used.

(Other Layer Structures)

A protective layer may be provided on the second silver halide emulsion layer. The term "protective layer" in the present embodiment indicates a layer formed of a binder such as gelatin or a high molecular weight polymer. Further, since the protective layer exhibits effects for preventing abrasion and improving mechanical characteristics, the protective layer is formed on the photosensitive silver halide emulsion layer having photosensitivity. The thickness thereof is preferably 0.5 μm or less. The coating method and the formation method of a protective layer are not particularly limited, and the methods can be suitably selected from among known coating methods and formation methods. Further, for example, an antihalation layer can be provided on the lower side of the first silver halide emulsion layer.

(Simultaneous Multilayer Coating)

The coating method and the formation method of each layer are not particularly limited, but it is preferable to use a simultaneous multilayer coating described in JP1991-219237A (JP-H03-219237A), from the viewpoint of simplifying the production process. When the simultaneous multilayer coating described in JP1991-219237A (JP-H03-219237A) is used, in addition to the first silver halide emulsion layer, the second silver halide emulsion layer, and the light absorption layer, the protective layer and the antihalation layer can be simultaneously formed through one-pass coating.

Hereinafter, respective processes of the method for preparing a conductive member will be described.

(Light Exposure)

In the present invention, multiple layers of silver halide emulsion layers provided on the transparent support are exposed to light from only one surface side or both surface sides. The light exposure can be carried out using electromagnetic waves. Examples of the electromagnetic waves include visible light, tungsten light, and a mercury lamp. For light exposure, light sources with wavelength distribution may be used or light sources having a specific wavelength may be used.

As the above-described light source, scanning exposure using a cathode ray tube (CRT) may be exemplified. A cathode ray tube device is simple, compact, and inexpensive, compared to a device using laser. Moreover, an optical axis and a color can be easily adjusted. Various light emitters showing light emission in spectral regions, if necessary, are used for a cathode ray tube used for image exposure. For example, one or two or more of a red emitter, a green emitter, and a blue emitter can be used in combination. The spectral regions are not particularly limited to the above-described red, green and blue emitters, and fluorescent substances emitting light in yellow, orange, violet, or infrared regions may be used. Particularly, a cathode ray tube which emits white light by mixing these light emitters is occasionally used. Further, an ultraviolet lamp is preferable, and a g-line of a mercury lamp and an i-line of a mercury lamp are also used.

Moreover, in the present invention, light exposure can be carried out using various laser beams. For example, a scanning exposure system using monochromatic high-density ht such as gas laser, a light emitting diode, semiconductor laser, or a second harmonic generation (SHG) light source formed by combining semiconductor laser or solid state laser using semiconductor laser for an excitation light source and a non-linear optical crystal can be preferably used. In order to make the system compact and inexpensive, it is preferable that light exposure is performed using semiconductor layer or a second harmonic generation (SHG) light source formed by combining semiconductor laser or solid state layer and a non-linear optical crystal. In order to design a device which is compact and inexpensive and has a long life and high stability, it is particularly preferable that light exposure is performed using semiconductor laser.

As a laser light source, specifically, green laser having a wavelength of approximately 530 nm, red semiconductor laser having a wavelength of approximately 685 nm (Hitachi type No. HL6738MG), red semiconductor layer having a wavelength of approximately 650 nm (Hitachi type No. HL6501MG), and red semiconductor layer having a wavelength of approximately 780 nm, in which blue semiconductor laser having a wavelength of 430 nm to 460 nm (publication of NICHIA Corp. at 48th Meeting of The Japan Society of Applied Physics and Related Societies on March 2001) and semiconductor layer (oscillation wavelength of 1060 nm) are extracted through wavelength conversion using a SHG crystal of LiNbO$_3$ having a waveguide-like inverted domain structure, are preferably used.

Further, in the present invention, it is preferable that the light transmittance having a specific wavelength is controlled using an optional filter such as a sharp cut filter, a band absorption filter, or a band-pass filter. As such a filter, for example, an ultraviolet absorption filter (SC filter) and a light absorption and infrared transmission filter (IR filter) (both manufactured by Fujifilm Corp.) can be used.

For example, in a case where the emulsion in the first silver halide emulsion layer is spectrally sensitized in a wavelength region of 500 nm or greater and the emulsion in the second silver halide emulsion layer does not have a spectral sensitivity in a wavelength region of 500 nm or greater, the image thicknesses or the concentrations of the respective first silver halide emulsion layer and second silver halide emulsion layer can be adjusted by transmitting only light having an optimum wavelength for exposure of the respective first silver halide emulsion layer and second silver halide emulsion layer using a filter that adjusts the light transmittance of less than 500 nm and/or a filter that adjusts the light transmittance of 500 nm or greater. Among light having a wavelength of less than 500 nm applied to the second silver halide emulsion layer, it is possible for light passing through the second silver halide emulsion layer not to substantially reach the first silver halide emulsion layer by adjusting the amount of the solid dispersion dye contained in the light absorption layer disposed on the first silver halide emulsion layer.

In the present invention, it is preferable that a pattern is formed by exposing the silver halide photosensitive material to light through a photomask. The shape of the pattern is not particularly limited.

(Development Treatment)

In the present embodiment, a development treatment is performed after the photosensitive silver halide emulsion layer is exposed to light. The development treatment can be performed using a typical technology of a development treatment used for a silver salt photographic film, a photographic printing paper, a film for a printing plate, or an emulsion mask for a photomask. The development is not particularly limited, and examples thereof include a PQ developer (developer obtained by combining phenidone and hydroquinone), an MQ developer (a developer including metol and hydroquinone as a principal agent, and an MAA developer (metol-ascobic acid developer). Examples of commercially available products thereof include developers such as CN-16, CR-56, CP45X, FD-3, and PAPITOL (prescribed by Fujifilm Corp.), C-41, E-6, RA-4, D-19, and D-72 (prescribed by Kodak Japan Ltd.). Further, developers included in kits thereof can be used. Further, a lith developer can be used.

The development treatment of the present invention may include a fixing process that is performed for the purpose of removing silver salts in an unexposed portion for stabilization. The fixing treatment of the present invention can be performed using a technology of a fixing treatment used for a silver salt photographic film, a photographic printing paper, a film for a printing plate, or an emulsion mask for a photomask.

The fixing temperature in the above-described fixing treatment is preferably approximately 20° C. to approximately 50° C. and more preferably in a range of 25° C. to 45° C. Further, the fixing time is preferably in a range of 5 seconds to 1 minute and more preferably in a range of 7 seconds to 50 seconds. The replenishing amount of a fixer is preferably 600 ml/m$^2$ or less, more preferably 500 ml/m$^2$ or less, and particularly preferably 300 ml/m$^2$ or less.

It is preferable that the photosensitive material to which the development treatment and the fixing treatment are applied is subjected to a water washing treatment or a stabilization treatment. In the above-described water washing treatment or stabilization treatment, the amount of water for washing may be 20 L or less and the replenishing amount of water may be 3 L or less (including 0 L, that is, washing with stored water) per 1 m$^2$ of a typical photosensitive material.

The mass of the silver metal contained in an exposed portion after the development treatment is preferably 50% by mass or greater and more preferably 80% by mass or greater with respect to the mass of silver contained in the exposed portion before light exposure. It is preferable that the mass of silver contained in the exposed portion is 50% by mass or greater with respect to the mass of silver contained in the exposed portion before exposure from the viewpoint that high conductivity can be obtained.

The gradation after the development treatment in the present embodiment is not particularly limited, but is preferably greater than 4.0. When the gradation after the development treatment exceeds 4.0, the conductivity of a conductive metal portion can be improved in a state in which light transmitting properties of the light transmitting portion are highly maintained. As means for setting the gradation to be 4.0 or greater, doping of the above-described rhodium ions or iridium ions may be exemplified.

The conductive member can be obtained by performing the above-described processes, and the surface resistance of the obtained conductive member is preferably in a range of 0.1 ohm/sq to 100 ohm/sq. The lower limit thereof is preferably 1 ohm/sq or greater, more preferably 3 ohm/sq or greater, still more preferably 5 ohm/sq or greater, and even still more preferably 10 ohm/sq or greater. The upper limit thereof is preferably 70 ohm/sq or less and more preferably 50 ohm/sq or less. When the surface resistance is adjusted to be in the above-described range, a large-sized touch panel having an area of 10 cm×10 cm or greater can be position-detected. In addition, the conductive member 20 after the treatment may be subjected to a calender treatment and the surface treatment thereof can be adjusted to have a desired value by performing a calender treatment.

(Physical Development and Plating Treatment)

In the present embodiment, for the purpose of improving the conductivity of the conductive pattern formed by performing simultaneous both surface light exposure and the development treatment, the conductive pattern may be subjected to a physical development and/or a plating treatment for carrying conductive metal particles. In the present invention, the conductive metal particles may be carried by a metallic silver portion by performing only the physical development or the plating treatment, or the conductive metal particles may be carried by the conductive pattern by combining the physical development and the plating treatment. Further, the term "conductive metal portion" includes a conductive pattern subjected to physical treatment and/or the plating treatment.

The "physical treatment" in the present embodiment is carried out by reducing metal ions such as silver ions with a reducing agent and depositing metal particles on a nucleus of a metal or a metal compound. This physical development is used for producing instant B&W films, instant slide films, and printing plates and the technology can be used in the present invention. Further, the physical development may be performed simultaneously with or separately from the development treatment after light exposure.

In the present embodiment, electroless plating (chemical reduction plating or displacement plating) can be used for the plating treatment. As the electroless plating of the present embodiment, a known electroless plating technology, for example, an electroless plating technology used for a printed circuit board or the like, can be used. It is preferable that the electroless plating is electroless copper plating.

(Oxidation Treatment)

In the present embodiment, it is preferable that the conductive pattern after the development treatment and the conductive metal portion formed by the physical treatment and/or the plating treatment are subjected to an oxidation treatment. For example, in a case where a metal is slightly deposited on the light transmitting portion, the metal is removed and the light transmitting properties of the light transmitting portion can be adjusted to approximately 100% by performing the oxidation treatment.

(Conductive Metal Portion)

The line width of the conductive pattern of e present embodiment is, for example, in a range of 1 µm to 20 µm, preferably in a range of 1 µm to 15 µm, more preferably in a range of 1 µm to 10 µm, still more preferably in a range of 5 µm to 10 µm, and most preferably in a range of 5 µm to 9 µm. In a case where the line width thereof is less than the above-described lower limit, the conductivity becomes insufficient and thus detection sensitivity becomes insufficient in a case where of using a touch panel. In addition, when the line width exceeds the above-described upper limit, moire resulting from the conductive metal portion becomes significant and the visibility at the time of using a touch panel becomes worse. Moreover, when the line width thereof is in the above-described range, the moire of the conductive metal portion is improved and the visibility is particularly improved. The line interval is preferably in a range of 30 µm to 500 µm, more preferably in a range of 50 µm to 400 µm, and most preferably in a range of 100 µm to 350 µm. Further, for the purpose of ground connection or the like, it is preferable that the conductive metal portion has a portion wider than a portion having a line width of 200 µm.

The aperture ratio (transmittance) of the conductive pattern of the present embodiment is preferably 85% or greater, more preferably 90% or greater, and most preferably 95% or greater from the viewpoint of visible light transmittance. The aperture ratio indicates a porosity of a portion on which the conductive pattern of a thin metal wire is not formed.

(Light Transmitting Portion)

The "light transmitting portion" of the present embodiment indicates a portion having light transmitting properties other than the conductive pattern in the conductive member. In regard to the transmittance in the light transmitting portion, as described above, the transmittance shown as a minimum value of the transmittance in a wavelength region of 380 nm to 780 nm, from which contribution to light absorption and reflection of the transparent support is excluded, is 90% or greater, preferably 95% or greater, more preferably 97% or greater, still more preferably 98% or greater, and most preferably 99% or greater.

As the light exposure method, a method using a glass mask or a pattern exposure method using laser drawing is preferable.

(Conductive Member)

The thickness of the transparent support in the conductive member according to the present embodiment is preferably in a range of 5 µm to 500 µm and more preferably in a range of 30 µm to 150 µm. When the thickness thereof is in a range of 5 µm to 500 µm, a desired transmittance of visible light can be obtained and the conductive member is easily handled.

The thickness of the conductive pattern provided on the transparent support can be suitably determined according to the thickness of the photosensitive silver halide emulsion layer applied to the transparent support. The thickness of the conductive pattern can be selected from a range of 0.001 mm to 0.2 mm, but is preferably 30 µm or less, more preferably 20 µm or less, still more preferably 0.01 µm to 9 µm, and most preferably 0.05 µm to 5 µm. The conductive pattern has a multilayer structure having two or more layers. In a case of a multilayer structure having two or more layers, different color sensitivity can be provided for the conductive pattern so as to be photosensitive to different wavelengths. In this manner, patterns different from each other can be formed in respective layers when light exposure is performed by changing the exposure wavelength.

In regard to the applications of a touch panel, it is preferable that the thicknesses of the thin metal wires 23 and 27 of the conductive pattern are as small as possible from the viewpoint that the viewing angle of a display panel becomes widened. From the viewpoint of improving the visibility, a reduction in film thickness is required. From this viewpoint, the thickness of a layer formed of conductive metals carried by the conductive pattern is preferably less than 9 µm, more preferably in a range of 0.1 µm to less than 5 µm, and still more preferably in a range of 0.1 µm to less than 3 µm.

In the present embodiment, a conductive pattern having a desired thickness is formed by controlling the coating thickness of the above-described first silver halide emulsion layer and second silver halide emulsion layer, and the thickness of the layer formed of conductive metal particles can be freely controlled by performing physical development and/or the plating treatment. Accordingly, even a conductive member having a thickness of less than 5 µm and preferably less than 3 µm can be easily formed.

Figure 10A:
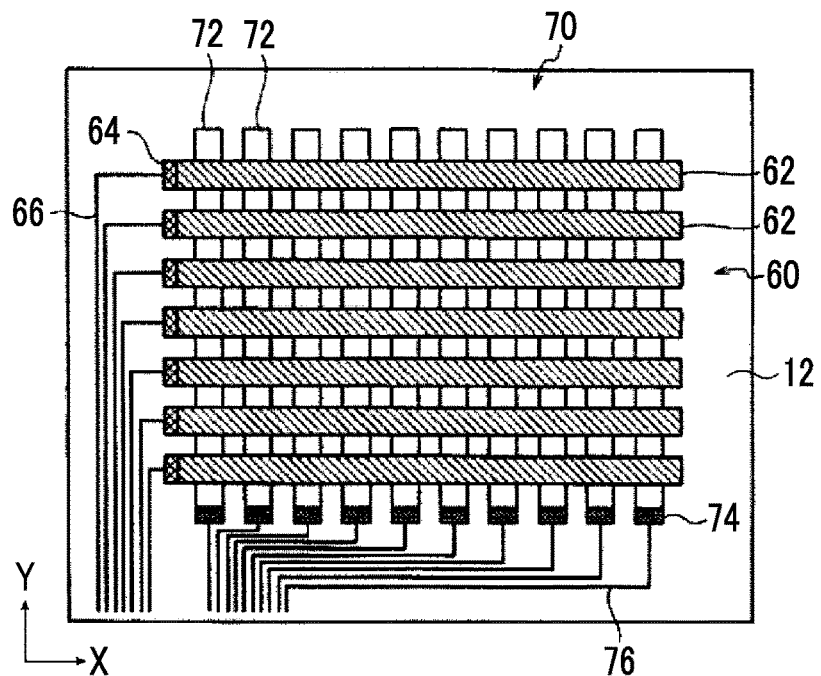
FIG. 10A is a plan view schematically showing an example of a conductive pattern formed on a transparent support and FIG. 10B is a plan view schematically showing the details of the configuration of a second conductive pattern formed on the transparent support.
Figure 10B:
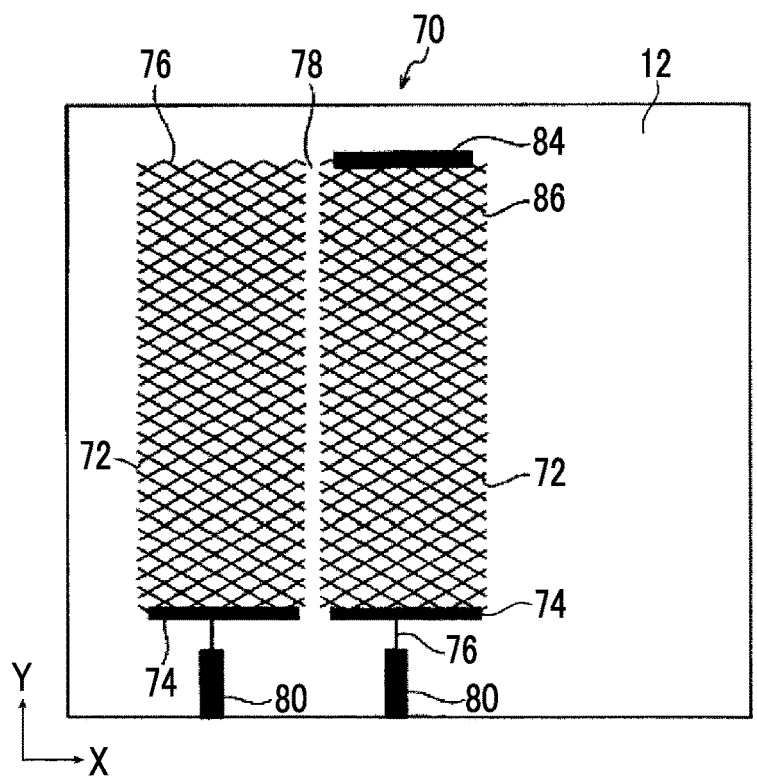
Figure 11A:
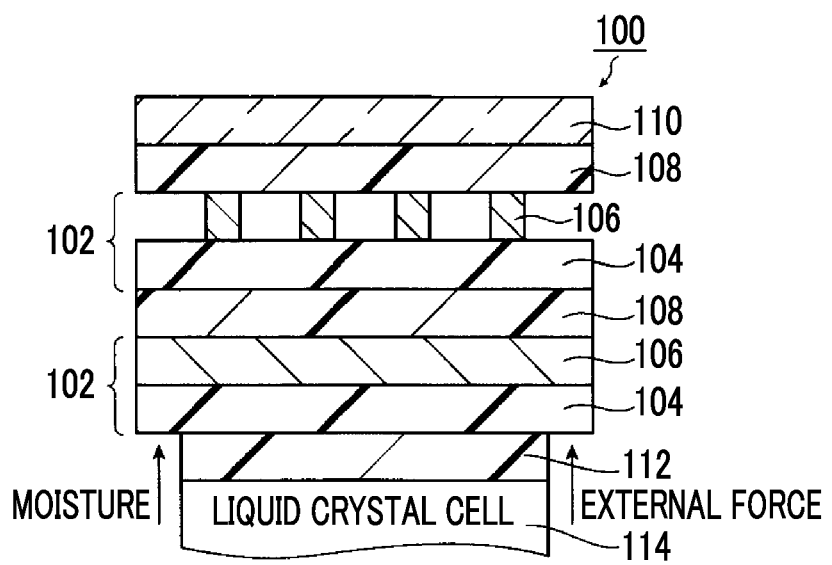
FIG. 11A is a view schematically showing a touch panel sensor of the related art and FIG. 11B is a view schematically showing another example of a touch panel sensor of the related art.
Figure 11B:
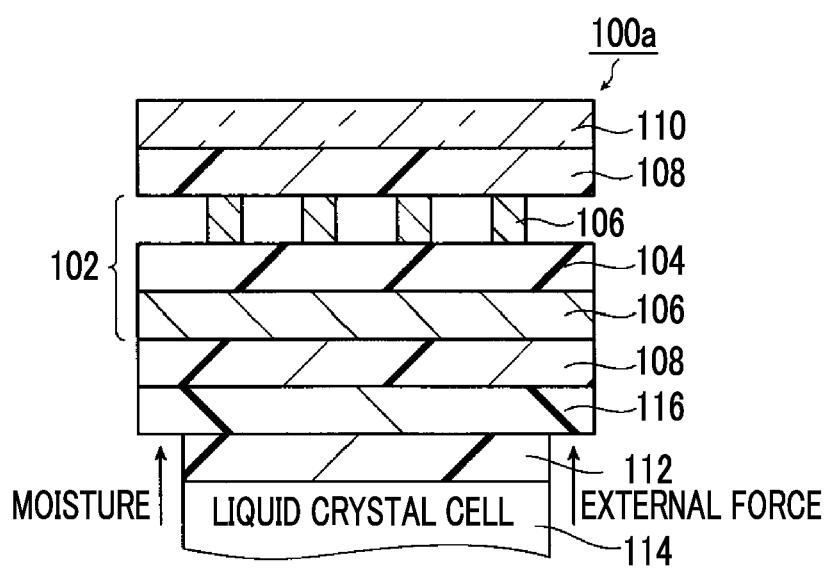

In the present invention, the conductive pattern of the conductive member is not particularly limited and various patterns can be used. Here, FIG. 10A is a plan view schematically showing an example of a conductive pattern formed on a transparent support and FIG. 10B is a plan view schematically showing the details of the configuration of a second conductive pattern formed on the transparent support. Further, in FIGS. 10A and 10B, members having the same configuration as that of the conductive member 20 shown in FIG. 3C are denoted by the same reference numeral and the detailed description thereof will not be repeated.

For example, the conductive patterns include the first conductive pattern 60 configured of a thin metal wire and the second conductive pattern 70 configured of a thin metal wire. The first conductive pattern 60 extends in an X direction and includes a plurality of first conductive patterns 62 disposed in parallel with each other. The second conductive pattern 70 extends in a Y direction perpendicular to the X direction and includes second conductive patterns 72 disposed in parallel with each other.

One end of each first conductive pattern 62 is electrically connected to a first conductive terminal 64. Further, each first conductive terminal 64 is electrically connected to a conductive first wiring 66. One end of each second conductive pattern 72 is electrically connected to a second conductive terminal 74. Further, each second conductive terminal 74 is electrically connected to a conductive second wiring 76.

Hereinafter, between the first conductive pattern 60 and the second conductive pattern 70, for example, the second conductive pattern 70 will be described in detail with reference to FIG. 10B. The second conductive pattern 70 is configured of plural lattices formed of a thin metal wire as shown in FIG. 10B. The second conductive pattern 70 extends the Y direction and includes a plurality of second conductive patterns 72 disposed in parallel with each other. The respective second conductive patterns 72 are electrically connected to the second conductive terminal 74. The respective second conductive patterns 72 are electrically separated due to a second non-conductive pattern 78.

The thin metal wire constituting the second conductive pattern 70 is substantially formed of the same material having the same line width as that of the first conductive pattern 60. The second conductive pattern 70 includes a plurality of lattices 86 formed of thin metal wires intersecting each other. The shape of the lattice 86 is not particularly limited, and a fixed shape in which the same shape is regularly arranged or a random shape may be used. In a case of where the lattice has a fixed shape, a square shape, a rhombus shape, or a regular hexagon shape is preferable, and a rhombus shape is particularly preferable.

Each second conductive terminal 74 is electrically connected to a conductive second wiring 76. One end of each second conductive pattern 72 is electrically connected to the second conductive terminal 74. Each second conductive terminal 74 is electrically connected to one end of each second wiring 76. The other end of each second wiring 76 is electrically connected to a terminal 80. Each second conductive pattern 72 is configured to have a strip structure substantially having a constant width along the Y direction, but the configuration is not limited thereto. The other end of the second conductive pattern 70 may be provided with an additional second conductive terminal 84.

As the conductive pattern, in addition to those described above, electrode patterns described in JP2012-146277A, JP2012-163933A, JP2012-164648A, JP2012-190445A, JP2013-149237A, JP2013-149232A, and JP2013-149236A can be used. Further, in addition to these, patterns described in JP2011-513846A and WO2010/013679A can be used.

Moreover, in the method for producing a conductive member of the present embodiment, the plating process and the like are not necessarily performed because a desired surface resistance can be obtained by adjusting the amount of silver to be applied to a silver salt emulsion layer or the volume ratio of silver to a binder in the method for producing a conductive member of the present embodiment. Further, the calender treatment or the like may be performed as needed.

(Hardening Treatment after Development Treatment)

After the development treatment is performed on the first silver halide emulsion layer and the second silver halide emulsion layer, it is preferable that a hardening treatment is performed by immersing the layers in a hardener. Examples of the hardener include dialdehydes such as glutaraldehyde, adipaldehyde, and 2,3-dihydroxy-1,4-dioxane; and boric acid described in JP1990-141279A (JP-H02-141279A).

A functional layer such as an antireflection layer or a hard coat layer may be provided for a conductive member.

Furthermore, the present invention can be used in combination with technologies of publications and international publication pamphlets listed in Table 1. The notations such as "JP ~A," "Publication No." or "Pamphlet No." are omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |

TABLE 1-continued

| | | | | |
|---|---|---|---|---|
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |
| 2006/001461 | 2006/088059 | 2006/098333 | 2006/098336 | 2006/098338 |
| 2006/098335 | 2006/098334 | 2007/001008 | | |

The present invention is basically configured as described above. Hereinbefore, the method for producing a conductive member and the conductive member of the present invention have been described in detail, but the present invention is not limited to the above-described embodiments, and various improvements and modifications can be made within the range not departing from the scope of the present invention.

EXAMPLES

Hereinafter, the present invention will be described in detail with reference to the following examples. The materials, the use amounts, the proportions, the treatment contents, and the treatment procedures described in the following examples can be appropriately changed within the range not departing from the scope of the present invention. Accordingly, the range of the present invention should not be limitatively interpreted by the examples described below.

Example 1

Preparation of Emulsion

An emulsion including 10.0 g of gelatin with respect to 150 g of Ag in an aqueous medium and containing silver iodobromochloride grains (I=0.2% by mole and Br=40% by mole) having an average equivalent spherical diameter of 0.1 μm was prepared.

Further, $K_3Rh_2Br_9$ and $K_2IrCl_6$ were added to this emulsion such that the concentration thereof became $10^{-7}$ (mol/mol silver), and silver bromide grains were doped with Rh ions and Ir ions. $Na_2PdCl_4$ were added to the emulsion and gold sulfur sensitization was performed using chlorauric acid and sodium thiosulfate.

<<Emulsion Layer Coating Solution a>>

| | |
|---|---|
| Emulsion | (silver amount of 7.0 g/m$^2$) |
| Spectral sensitizing dye (Chem. 1) | 5.3 × 10$^{-4}$ mol/Ag mol |
| Spectral sensitizing dye (Chem. 2) | 3.5 × 10$^{-4}$ mol/Ag mol |
| KBr | 3.4 × 10$^{-4}$ mol/Ag mol |
| 4-hydroxy-6-methyl-1,3,3a,7-tetraazaindene | 1.2 × 10$^{-4}$ mol/Ag mol |
| Hydroquinone | 1.2 × 10$^{-2}$ mol/Ag mol |
| Citric acid | 3.0 × 10$^{-4}$ mol/Ag mol |
| 5-methylbenzotriazole | 20 mg/m$^2$ |
| 2,4-dichloro-6-hydroxy-1,3,5-triazine sodium salt | 210 mg/m$^2$ |
| Polyethylacrylate latex | 350 mg/m$^2$ |
| Gelatin | 4.5 g/m$^2$ |

Further, when the spectral sensitization region of the silver halide emulsion used for the first silver halide emulsion layer coating solution was measured, the region thereof was in a range of 450 nm to 650 nm (maximum absorption wavelength: 530 nm).

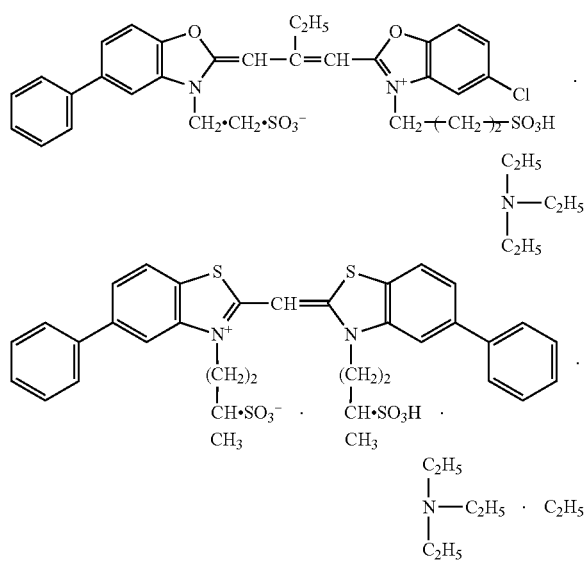

<<Emulsion Layer Coating Solution b>>

An emulsion layer coating solution b was prepared in the same manner as that of the emulsion layer coating solution a except that the emulsion layer coating solution b did not contain a spectral sensitizing dye. When the sensitization region of the silver halide emulsion used for the emulsion layer coating solution b was measured, the sensitization region thereof was a specific absorption region of the silver halide because a spectral sensitizing dye was not added and was approximately 250 nm to 420 nm.

<<Light Absorption Layer Coating Solution>>

| | |
|---|---|
| Fixed dispersion dye (the following Chemical Formula 3) | 800 mg/m² |
| Gelatin | 2.0 g/m² |
| Surfactant | 500 mg/m² |
| Polystyrene sulfonic acid | 1.2 g/m² |

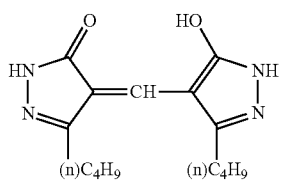

<<Preparation of Silver Halide Photosensitive Material>>

A first silver halide emulsion layer, a light absorption layer, and a second silver halide emulsion layer were laminated on a transparent support PET, in this order from the transparent support side, and the amount of a solvent and the physical properties of a coating solution were adjusted and multilayer coating was carried out such that the coating amount of the layers was set to be in the above-described range, thereby preparing a silver halide photosensitive material.

(Light Exposure)

The light exposure was performed from the A surface side, in other words, the second silver halide emulsion layer side with parallel light using a high-pressure mercury lamp as a source through a photomask used to form a conductive pattern having a line width of 10 μm and a wiring pitch of 300 μm. At this time, the thickness and the concentration of a pattern portion of a first silver halide emulsion layer image and a second silver halide emulsion layer image were adjusted by performing light exposure through a light transmittance adjustment filter selected from sharp cut filter SC37 to SC41 (trade names, manufactured by Fujifilm Corp.), a photomask (line width=10 vim and wiring pitch=100 μm) for patterning of the first silver halide emulsion layer, and a photomask (line width=10 μm and wiring pitch=100 μm) for patterning of the second silver halide emulsion layer. The exposure wavelength peak of light applied to the first silver halide emulsion layer was 530 nm and the exposure wavelength peak of light applied to the second silver halide emulsion layer was 360 nm.

(Development Treatment)

| Formulation of 1 L of developer | |
|---|---|
| Hydroquinone | 20 g |
| Sodium sulfite | 50 g |
| Potassium carbonate | 40 g |
| Ethylenediaminetetraacetic acid | 2 g |
| Potassium bromide | 3 g |
| Polyethylene glycol 2000 | 1 g |
| Potassium hydroxide | 4 g |
| pH | Adjusted to 10.3 |

| Formulation of 1 L of fixer | |
|---|---|
| Ammonium thiosulfate solution (75%) | 300 mL |
| Ammonium sulfite·monohydrate | 25 g |
| 1,3-diaminopropane·tetraacetic acid | 8 g |
| Acetic acid | 5 g |
| Ammonia water (27%) | 1 g |
| pH | adjusted to 6.2 |

The exposure sensitive material was subjected to a treatment using the above-described treatment agent and an automatic developing machine (FG-710PTS, manufactured by Fujifilm Corp.) under the treatment conditions of developing at 35° C. for 30 seconds, fixing at 34° C. for 23 seconds, and washing with water and running water (5 L/min) for 20 seconds. By performing this development treatment, a conductive member having a conductive pattern formed on one surface of the transparent support was obtained. The array pitch of the conductive pattern was 100 μm, the thickness thereof was 2 μm, and the line width thereof was 10 μm.

Example 2

A sample was prepared in the same manner as in Example 1 except that the exposure wavelength peak of light applied to the first silver halide emulsion layer was set to 360 nm and the exposed surface was changed to a B surface, that is, the rear surface of the transparent support.

Example 3

A sample was prepared in the same manner as in Example 1 except that the exposed surface applying light to the first silver halide emulsion layer was changed to the B surface.

Example 4

A sample was prepared in the same manner as in Example 1 except that the addition amount of the solid dispersion dye was changed such that the solid content coating amount of the solid dispersion dye included in the light absorption layer became 400 mg/m$^2$.

Example 5

A sample was prepared in the same manner as in Example 1 except that the addition amount of the solid dispersion dye was changed such that the solid content coating amount of the solid dispersion dye included in the light absorption layer became 200 mg/m$^2$.

Example 6

A sample was prepared in the same manner as in Example 1 except that the addition amount of the solid dispersion dye was changed such that the solid content coating amount of the solid dispersion dye included in the light absorption layer became 1,300 mg/m$^2$.

Example 7

A sample was prepared in the same manner as in Example 1 except that the addition amount of the solid dispersion dye was changed such that the solid content coating amount of the solid dispersion dye included in the light absorption layer became 1,500 mg/m$^2$.

Example 8

A sample was prepared in the same manner as in Example 1 except that the addition amount of the solid dispersion dye was changed such that the solid content coating amount of the solid dispersion dye included in the light absorption layer became 2,000 mg/m$^2$.

Example 9

A sample was prepared in the same manner as in Example 1 except that the addition amount of the solid dispersion dye was changed such that the solid content coating amount of the solid dispersion dye included in the light absorption layer became 100 mg/m$^2$.

Comparative Example 1

A sample was prepared in the same manner as in Example 1 except that the solid dispersion dye included in the light absorption layer was removed.

Comparative Example 2

A sample was prepared in the same manner as in Example 2 except that the solid dispersion dye included in the light absorption layer was removed.

Comparative Example 3

A sample was prepared in the same manner as in Example 3 except that the solid dispersion dye included in the light absorption layer was removed.

<Evaluation>

(Insulation Resistance Value)

Among light having a wavelength of less than 500 nm applied to the first silver halide emulsion layer or the second silver halide emulsion layer, light passing through the second silver halide emulsion layer on the side close to the light source is required to be absorbed by the light absorption layer disposed on the first silver halide emulsion layer so that light exposure of the first silver halide emulsion layer on the side far from the light source is prevented, but the light reaches the silver halide emulsion layer on the side far from the light source when the amount of the solid dispersion dye in the light absorption layer is insufficient. As a result, a conductive pattern unnecessary for the first silver halide emulsion layer on the side far from the light source is formed and thus the insulation resistance is decreased.

Here, it is possible to evaluate whether the absorption ability of the light absorption layer is insufficient by preparing a reference sample, measuring insulation resistance values among conductive patterns adjacent to the reference sample, and observing the amount of a decrease in insulation measurement value.

(Preparation of Reference Sample for Evaluation)

After the same silver halide photosensitive material as the material of Example 1 was prepared, only light exposure for the first silver halide emulsion layer was performed through a photomask (line width=10 μm and wiring pitch=100 pin) for the first silver halide emulsion layer, the first silver halide emulsion layer was further subjected to a development treatment, and then a reference sample 1 for evaluation of the first silver halide emulsion layer having a conductive pattern (array pitch=100 μm) only formed thereon was prepared.

The conduction of the pattern formed on the first silver halide emulsion layer can be evaluated and measured by adjusting the shape and the installation pressure of a terminal of a conduction inspection machine. However, in the present example, the conduction thereof was able to be simply evaluated by preparing a sample in which the coating width of the light absorption layer and the second silver halide emulsion layer was narrowed with respect to the coating width of the first silver halide emulsion layer.

Thereafter, in the reference sample 1 for evaluation, 10 sites which were the points for measuring the insulation resistance between conductive patterns adjacent to each other, the insulation resistance values of these 10 sites were measured using an insulation resistance measuring machine, and the average value thereof was set to an insulation resistance value R-1 of the reference sample 1 for evaluation.

Similarly, only light exposure for the second silver halide emulsion layer was performed through a photomask (line width=10 μm and wiring pitch=100 μm) for the second silver halide emulsion layer, the second silver halide emulsion layer was further subjected to a development treatment, and a reference sample 2 for evaluation of the second silver halide emulsion layer having a conductive pattern (array pitch=100 μm) only formed thereon was prepared, and then an insulation resistance value R-2 of the reference sample 2 for evaluation was acquired in the same manner as described above.

(Evaluation Method)

In the first silver halide emulsion layer of the sample in Example 1, 10 sites which were the points for measuring the insulation resistance between conductive patterns adjacent to each other, the insulation resistance values of these 10 sites were measured using an insulation resistance measuring machine, and the average value thereof was set to an insulation resistance value S-1 of Example 1. Similarly, an insulation resistance value S-2 of the second silver halide emulsion layer of the sample in Example 1 was acquired. In addition, respective insulation resistance values of respective samples of Examples 2 to 7 and Comparative Examples 1 and 2 were acquired in the same manner as that of the sample in Example 1 described above. Further, the evaluation was performed in the following manner.

(a) A case where the respective insulation resistance values S-1 and S-2 of the respective samples showed a reduction of less than 1% of the insulation resistance values R-1 and R-2 of the corresponding reference samples for evaluation was evaluated as "A."

(b) A case where the respective insulation resistance values S-1 and S-2 of the respective samples showed a reduction of 2% or greater and less than 3% of the insulation resistance values R-1 and R-2 of the corresponding reference samples for evaluation was evaluated as "B."

light leakage and it was understood that the states of light exposure were excellent. In Examples 7 and 8, the visible light transmittances were slightly reduced even though the states of light exposure were excellent. From this, it was understood that decoloration of the solid dispersion dye was not completely finished within a prescribed time for the development treatment.

Meanwhile, Comparative Examples 1 to 3 showed a reduction of 5% or greater of the insulation resistance value of the corresponding reference sample for evaluation. This indicates that unnecessary conductive patterns were formed due to light leakage and it was understood that the states of light exposure were poor.

TABLE 2

|  | First photo-sensitive emulsion layer coating solution | Second photo-sensitive emulsion layer coating solution | Exposure wave-length peak of first photo-sensitive layer (nm)/exposed surface | Exposure wave-length peak of second photo-sensitive layer (nm)/exposed surface | Coating amount of solid dispersion dye (mg/m$^2$) | Amount of silver to be applied to first photo-sensitive layer (support side) (mg/m$^2$) | Amount of silver to be applied to second photo-sensitive layer (support side) (mg/m$^2$) | Insulation resistance | Visible light trans-mittance |
|---|---|---|---|---|---|---|---|---|---|
| Example 1 | a | b | 530/A surface | 360/A surface | 800 | 7 | 7 | A | A |
| Example 2 | b | b | 360/B surface | 360/A surface | 800 | 7 | 7 | B | A |
| Example 3 | a | b | 530/B surface | 360/A surface | 800 | 7 | 7 | B | A |
| Example 4 | a | b | 530/A surface | 360/A surface | 400 | 7 | 7 | A | A |
| Example 5 | a | b | 530/A surface | 360/A surface | 200 | 7 | 7 | B | A |
| Example 6 | a | b | 530/A surface | 360/A surface | 1300 | 7 | 7 | A | A |
| Example 7 | a | b | 530/A surface | 360/A surface | 1500 | 7 | 7 | A | B |
| Example 8 | a | b | 530/A surface | 360/A surface | 2000 | 7 | 7 | A | C |
| Example 9 | a | b | 530/A surface | 360/A surface | 100 | 7 | 7 | B | A |
| Comparative Example 1 | a | b | 530/A surface | 360/A surface | 0 | 7 | 7 | D | A |
| Comparative Example 2 | a | b | 360/B surface | 360/A surface | 0 | 7 | 7 | D | A |
| Comparative Example 3 | a | b | 530/b surface | 360/A surface | 0 | 7 | 7 | D | A |

(c) A case where the respective insulation resistance values S-1 and S-2 of the respective samples showed a reduction of 3% or greater and less than 5% of the insulation resistance values R-1 and R-2 of the corresponding reference samples for evaluation was evaluated as "C."

(d) A case where the respective insulation resistance values S-1 and S-2 of the respective samples showed a reduction of 5% or greater of the insulation resistance values R-1 and R-2 of the corresponding reference samples for evaluation was evaluated as "D."

(Evaluation (Visible Light Transmittance))

The visible light transmittances of light transmitting portions were measured using CM-360 (manufactured by KONICA MINOLTA, INC.), and a case where the visible light transmittance thereof was 95% or greater was evaluated as "A," a case where the visible light transmittance thereof was 90% or greater and less than 95% was evaluated as "B," and a case where the visible light transmittance thereof was less than 90% was evaluated as "C."

(Evaluation Results)

As listed in the following Table 2, in all Examples 1 to 9, the insulation resistance values showed a reduction of less than 3% of the insulation resistance value of the corresponding reference sample for evaluation, and particularly Examples 1, 4, 6, 7, and 8 showed a reduction of less than 1% of the insulation resistance value of the corresponding reference sample for evaluation. This indicates that most of unnecessary conductive patterns were not formed due to

EXPLANATION OF REFERENCES 10, 10a, 10b: photosensitive material
12: transparent support
14: first silver halide emulsion layer
16: light absorption layer
18: second silver halide emulsion layer
20: conductive member
22: first conductive layer
23, 27: thin metal wire
24: electrically insulating layer
26: second conductive layer
30: first photomask
32: second photomask
34: collimator lens
36: light source
36B: second light source
36G: first light source
38B: B light
38G: G light
60, 62: first conductive pattern
70, 72: second conductive pattern

What is claimed is:

1. A method for producing a conductive member comprising:
    forming a first silver halide emulsion layer, a light absorption layer, and a second silver halide emulsion layer on a transparent support in this order; and performing pattern exposure on the first silver halide emulsion layer and the second silver halide emulsion layer and applying a development treatment thereto to obtain a conductive layer including a thin metal wire, wherein the light absorption layer absorbs at least a part of the wavelengths of light to which the first silver halide emulsion layer or the second silver halide emulsion layer is exposed.

2. The method for producing a conductive member according to claim 1, wherein a pattern in which the first silver halide emulsion layer is exposed to light is different from a pattern in which the second silver halide emulsion layer is exposed to light, at least in part, in the performing of the pattern exposure on the first silver halide emulsion layer and the second silver halide emulsion layer.

3. The method for producing a conductive member according to claim 2,
wherein the spectral sensitivity of the first silver halide emulsion layer is different from the spectral sensitivity of the second silver halide emulsion layer,
the first silver halide emulsion layer and the second silver halide emulsion layer are respectively exposed to light having wavelengths different from each other, from one side of a front surface and a rear surface of the transparent support, and
the light absorption layer absorbs either of the light having wavelengths different from each other.

4. The method for producing a conductive member according to claim 2,
wherein the spectral sensitivity of the first silver halide emulsion layer is the same as the spectral sensitivity of the second silver halide emulsion layer,
the first silver halide emulsion layer and the second silver halide emulsion layer are respectively exposed to light having the same wavelength, from the surface or the rear surface of the transparent support, and
the light absorption layer absorbs light having the same wavelength.

5. The method for producing a conductive member according to claim 2,
wherein the spectral sensitivity of the first silver halide emulsion layer is different from the spectral sensitivity of the second silver halide emulsion layer,
the first silver halide emulsion layer and the second silver halide emulsion layer are respectively exposed to light having wavelengths different from each other, from the surface or the rear surface of the transparent support, and
the light absorption layer absorbs either of the light having wavelengths different from each other.

6. The method for producing a conductive member according to claim 2, wherein the timing of light exposure of the first silver halide emulsion layer is the same as that of the second silver halide emulsion layer.

7. The method for producing a conductive member according to claim 2, wherein the first silver halide emulsion layer and the second silver halide emulsion layer each contain a binder.

8. The method for producing a conductive member according to claim 2,
wherein the light absorption layer contains a solid dispersion dye, and
the coating amount of the solid dispersion dye is in a range of 200 mg/m$^2$ to 1,500 mg/m$^2$.

9. The method for producing a conductive member according to claim 2, wherein the conductive layer has a lattice-like pattern.

10. The method for producing a conductive member according to claim 1,
wherein the spectral sensitivity of the first silver halide emulsion layer is different from the spectral sensitivity of the second silver halide emulsion layer,
the first silver halide emulsion layer and the second silver halide emulsion layer are respectively exposed to light having wavelengths different from each other, from one side of a front surface and a rear surface of the transparent support, and
the light absorption layer absorbs either of the light having wavelengths different from each other.

11. The method for producing a conductive member according to claim 1,
wherein the spectral sensitivity of the first silver halide emulsion layer is the same as the spectral sensitivity of the second silver halide emulsion layer,
the first silver halide emulsion layer and the second silver halide emulsion layer are respectively exposed to light having the same wavelength, from the surface or the rear surface of the transparent support, and
the light absorption layer absorbs light having the same wavelength.

12. The method for producing a conductive member according to claim 1,
wherein the spectral sensitivity of the first silver halide emulsion layer is different from the spectral sensitivity of the second silver halide emulsion layer,
the first silver halide emulsion layer and the second silver halide emulsion layer are respectively exposed to light having wavelengths different from each other, from the surface or the rear surface of the transparent support, and
the light absorption layer absorbs either of the light having wavelengths different from each other.

13. The method for producing a conductive member according to claim 1, wherein the timing of light exposure of the first silver halide emulsion layer is the same as that of the second silver halide emulsion layer.

14. The method for producing a conductive member according to claim 1, wherein the first silver halide emulsion layer and the second silver halide emulsion layer each contain a binder.

15. The method for producing a conductive member according to claim 1,
wherein the light absorption layer contains a solid dispersion dye, and
the coating amount of the solid dispersion dye is in a range of 200 mg/m$^2$ to 1,500 mg/m$^2$.

16. The method for producing a conductive member according to claim 1, wherein the conductive layer has a lattice-like pattern.

17. A method for producing a conductive member comprising:
forming a first silver halide emulsion layer, a light absorption layer, and a second silver halide emulsion layer on a transparent support in this order; and
performing pattern exposure on the first silver halide emulsion layer and the second silver halide emulsion layer and applying a development treatment thereto to obtain a conductive layer including a thin metal wire,
wherein the timing of light exposure of the first silver halide emulsion layer is the same as that of the second silver halide emulsion layer, and a pattern in which the first silver halide emulsion layer is exposed to light is different from a pattern in which the second silver halide emulsion layer is exposed to light, at least in part, in the performing of the pattern exposure on the first silver halide emulsion layer and the second silver halide emulsion layer, wherein the spectral sensitivity of the first silver halide emulsion layer is different from the spectral sensitivity of the second silver halide emulsion layer, and the first silver halide emulsion layer and the second silver halide emulsion layer are respectively exposed to light having wavelengths different from each other, from one side of a front surface and a rear surface of the transparent support, and wherein the light absorption layer absorbs at least a part of the wavelengths of light to which the first silver halide emulsion layer or the second silver halide emulsion layer is exposed, and the light absorption layer absorbs either of the light having wavelengths different from each other.

18. A method for producing a conductive member comprising:

forming a first silver halide emulsion layer, a light absorption layer, and a second silver halide emulsion layer on a transparent support in this order; and performing pattern exposure on the first silver halide emulsion layer and the second silver halide emulsion layer and applying a development treatment thereto to obtain a conductive layer including a thin metal wire, wherein a pattern in which the first silver halide emulsion layer is exposed to light is different from a pattern in which the second silver halide emulsion layer is exposed to light, at least in part, in the performing of the pattern exposure on the first silver halide emulsion layer and the second silver halide emulsion layer, wherein the first silver halide emulsion layer and the second silver halide emulsion layer each contain a binder, the spectral sensitivity of the first silver halide emulsion layer is different from the spectral sensitivity of the second silver halide emulsion layer, and the first silver halide emulsion layer and the second silver halide emulsion layer are respectively exposed to light having wavelengths different from each other, from one side of a front surface and a rear surface of the transparent support, and wherein the light absorption layer absorbs at least a part of the wavelengths of light to which the first silver halide emulsion layer or the second silver halide emulsion layer is exposed, and the light absorption layer absorbs either of the light having wavelengths different from each other.

* * * * *